United States Patent [19]
Goti

[11] Patent Number: 5,638,539
[45] Date of Patent: Jun. 10, 1997

[54] TOOL FOR DEFINING COMPLEX SYSTEMS

[75] Inventor: Juan C. Goti, San Jose, Calif.

[73] Assignee: International Business Machines Corporation, Armonk, N.Y.

[21] Appl. No.: 203,107

[22] Filed: Feb. 28, 1994

[51] Int. Cl.$^6$ ................................................. G06F 17/00
[52] U.S. Cl. ......................... 395/601; 364/DIG. 1; 364/283.3
[58] Field of Search ................................ 395/600, 700

[56] References Cited

U.S. PATENT DOCUMENTS 5,019,961  5/1991  Addesso et al. .................. 364/DIG. 1
5,539,862  7/1996  Short et al. ...................... 395/50

OTHER PUBLICATIONS

A Model Driven Methodology For Client/Server System Design by C. Gane; Case Trends; Jul. 1993; pp. 23–28.
Principles of Information Systems Analysis and Design by H. D. Mills et al; ©1986 Academic Press, Inc.; Chapter 3, pp. 95–97.
"Designing by the Rules" by Alice Sandifer et al; Database Programming and Design, Jan., 1991; pp. 11–14.
"Specifying Business Rules" by Odell; Data Base Newsletter, vol. 21, No. 3, May/Jun. 1993; pp. 1, 12–16.
"A Rule by Any Other Name" by Sandifer et al; Database Programming and Design, Feb., 1991; pp. 11–13.
"Linking Rules to Models" by Sandifer et al; Database Programming and Design, Mar., 1991; pp. 13–16.
"The Next Paradigm" by T. Moriarty; Database Programming and Design, Feb., 1993; pp. 66–69.
"Business Rule Analysis" by T. Moriarty; Database Programming and Design; Apr., 1993; pp. 66–69.
"Where's the Business" by T. Moriatry; Database Programming and Design; May, 1993; pp. 68–69.
"Losing the Business" by T. Moriarty; Database Programming and Design; Jun. 1993; pp. 66–69.
"Testing From the Top" by T. Moriatry; Database Programming and Design; Aug. 1993; pp. 65–67.
"Visualizing Business Rules in Corporate Databases" by Chen et al; Industrial Management & Data Systems, vol. 92 No. 7, 1992; pp. 3–8.
"Finding, extracting, and Using Old Business Rules" by Gane; National Software Re–engineering & Maintenance Conference, Chicago; Apr. 20–22, 1993; pp. BB–1 –BB–9.

*Primary Examiner*—Thomas M. Heckler
*Attorney, Agent, or Firm*—Homer L. Knearl

[57] ABSTRACT

A computer resident tool for specifying and studying the functioning of complex systems by defining their functions in terms of components and connections. The components comprise transactions between the tool and the user, functional rules which are triggered by transactions and can create transactions, and information entities which are defined, modified and interrogated by functional rules and have dependency relationships with other information entities. The tool validates data both as it is entered by the user and globally after data entry is complete. The tool also produces lists of inconsistent system data and graphical representations of components and connections.

12 Claims, 32 Drawing Sheets

USER INPUT FACILITIES

USER INPUT VALIDATION FACILITIES

USER QUERY AND REPORTING FACILITIES

MULTIPLE SYSTEM FACILITIES

FIG. 13

TRANSACTION: PRESS UP-EXTERNAL BUTTON

| | |
|---|---|
| TRANSACTION NAME (UNIQUE IDENTIFIER) | : PRESS UP-EXTERNAL BUTTON |
| COMPLETENESS INDICATOR (YES OR NO) | : YES |
| NAME OF OWNING SYSTEM | : ELEVATOR |
| TRANSACTION TYPE (EVENT NOTIF, QUERY, REPORT) | : EVENT NOTIFICATION |
| CREATED BY (USER, SYSTEM) | : USER |
| LOGGED (YES, NO) | : NO |
| NAME OF SYSTEM SENT TO: (NONE OR SYSTEM NAME) | : NONE |

LIST OF DATA ELEMENT NAMES

SIGNAL_REQUEST_UP
NUMBER_FLOOR

TRIGGER SEQUENCE:      UP PICK-UP

RULES THAT CREATE (IF CREATED BY APPLICATION)
                     NONE

FIG. 14

TRANSACTION: PRESS DOWN-EXTERNAL BUTTON

| | |
|---|---|
| TRANSACTION NAME (UNIQUE IDENTIFIER) | : PRESS DOWN-EXTERNAL BUTTON |
| COMPLETENESS INDICATOR (YES OR NO) | : YES |
| NAME OF OWNING SYSTEM | : ELEVATOR |
| TRANSACTION TYPE (EVENT NOTIF, QUERY, REPORT) | : EVENT NOTIFICATION |
| CREATED BY (USER, SYSTEM) | : USER |
| LOGGED (YES, NO) | : NO |
| NAME OF SYSTEM SENT TO: (NONE OR SYSTEM NAME) | : NONE |

LIST OF DATA ELEMENT NAMES

SIGNAL_REQUEST_DOWN
NUMBER_FLOOR

TRIGGER SEQUENCE:          DOWN PICK-UP

RULES THAT CREATE (IF CREATED BY APPLICATION)

NONE

FIG. 15

TRANSACTION: PRESS FLOOR-INTERNAL BUTTON

| | |
|---|---|
| TRANSACTION NAME (UNIQUE IDENTIFIER) | : PRESS FLOOR-INTERNAL BUTTON |
| COMPLETENESS INDICATOR (YES OR NO) | : YES |
| NAME OF OWNING SYSTEM | : ELEVATOR |
| TRANSACTION TYPE (EVENT NOTIF, QUERY, REPORT) | : EVENT NOTIFICATION |
| CREATED BY (USER, SYSTEM) | : USER |
| LOGGED (YES, NO) | : NO |
| NAME OF SYSTEM SENT TO: (NONE OR SYSTEM NAME) | : NONE |

LIST OF DATA ELEMENT NAMES

SIGNAL_GO_TO_FLOOR

| | |
|---|---|
| TRIGGER SEQUENCE: | SET FLOOR REQUESTS |
| | PASSENGER TRAVEL |

RULES THAT CREATE (IF CREATED BY APPLICATION)

NONE

FIG. 16

TRANSACTION: DISPLAY STATE

| | |
|---|---|
| TRANSACTION NAME (UNIQUE IDENTIFIER) | : DISPLAY STATE |
| COMPLETENESS INDICATOR (YES OR NO) | : YES |
| NAME OF OWNING SYSTEM | : ELEVATOR |
| TRANSACTION TYPE (EVENT NOTIF, QUERY, REPORT) | : REPORT |
| CREATED BY (USER, SYSTEM) | : SYSTEM |
| LOGGED (YES, NO) | : NO |
| NAME OF SYSTEM SENT TO: (NONE OR SYSTEM NAME) | : NONE |

LIST OF DATA ELEMENT NAMES

GOING_UP
GOING_DOWN
NUMBER_FLOOR_CURRENT

TRIGGER SEQUENCE: NONE

RULES THAT CREATE (IF CREATED BY APPLICATION)
    SET FLOOR REQUESTS
    RESET FLOOR REQUESTS

FIG. 17

TRANSACTION: STOP, OPEN, AND CLOSE DOOR

| | |
|---|---|
| TRANSACTION NAME (UNIQUE IDENTIFIER) | : STOP, OPEN AND CLOSE |
| COMPLETENESS INDICATOR (YES OR NO) | : YES |
| NAME OF OWNING SYSTEM | : ELEVATOR |
| TRANSACTION TYPE (EVENT NOTIF, QUERY, REPORT) | : REPORT |
| CREATED BY (USER, SYSTEM) | : SYSTEM |
| LOGGED (YES, NO) | : NO |
| NAME OF SYSTEM SENT TO: (NONE OR SYSTEM NAME) | : NONE |

LIST OF DATA ELEMENT NAMES

TRIGGER SEQUENCE: RESET FLOOR REQUESTS
DETERMINE DIRECTION

RULES THAT CREATE (IF CREATED BY APPLICATION)
UP PICK-UP
DOWN PICK-UP
PASSENGER TRAVEL

FIG. 18

TRANSACTION: PASS-BY WITHOUT STOPPING

| | |
|---|---|
| TRANSACTION NAME (UNIQUE IDENTIFIER) | : PASS-BY WITHOUT STOPPING |
| COMPLETENESS INDICATOR (YES OR NO) | : YES |
| NAME OF OWNING SYSTEM | : ELEVATOR |
| TRANSACTION TYPE (EVENT NOTIF, QUERY, REPORT) | : REPORT |
| CREATED BY (USER, SYSTEM) | : SYSTEM |
| LOGGED (YES, NO) | : NO |
| NAME OF SYSTEM SENT TO: (NONE OR SYSTEM NAME) | : NONE |

LIST OF DATA ELEMENT NAMES

TRIGGER SEQUENCE:　　　　　NONE

RULES THAT CREATE (IF CREATED BY APPLICATION)
　　　　　　　　　　UP PICK-UP
　　　　　　　　　　DOWN PICK-UP
　　　　　　　　　　PASSENGER TRAVEL

FIG. 19

INFORMATION ENTITY: ELEVATOR POSITION

| | |
|---|---|
| INFORMATION ENTITY NAME (UNIQUE IDENTIFIER) | : ELEVATOR POSITION |
| COMPLETENESS INDICATOR (YES OR NO) | : YES |
| NAME OF OWNING SYSTEM | : ELEVATOR |
| INFORMATION ENTITY TYPE (DESCR OR LOG) | : DESCRIPTOR |

LIST OF DATA ELEMENT NAMES (THIS INFORMATION IS KEPT FOR EACH CAR - IN OUR CASE,
WE DISCUSS A SINGLE CAR SYSTEM)
NUMBER_FLOOR_CURRENT

DEPENDENCY CONNECTIONS:

| NAME: | SOURCE OR TARGET NAME: |
|---|---|
| GOING_UP | FLOOR REQUESTS |
| GOING_DOWN | FLOOR REQUESTS |

| | |
|---|---|
| NAME OF RULES THAT INTERROGATE | : UP PICK-UP<br>DOWN PICK-UP<br>DETERMINE DIRECTION<br>PASSENGER TRAVEL |
| NAME OF RULES THAT MODIFY | : NONE |
| NAME OF RULES THAT DEFINE | : DEFINE ELEVATOR POSITION |

FIG. 20

INFORMATION ENTITY: FLOOR REQUESTS

| | |
|---|---|
| INFORMATION ENTITY NAME (UNIQUE IDENTIFIER) | : FLOOR REQUESTS |
| COMPLETENESS INDICATOR (YES OR NO) | : YES |
| NAME OF OWNING SYSTEM | : ELEVATOR |
| INFORMATION ENTITY TYPE (DESCR OR LOG) | : DESCRIPTOR |

LIST OF DATA ELEMENT NAMES

NUMBER_FLOOR (REPEATING FOR EACH FLOOR)
    SIGNAL_GO_TO_FLOOR
    SIGNAL_REQUEST_DOWN
    SIGNAL_REQUEST_UP

DEPENDENCY CONNECTIONS:

| NAME: | SOURCE OR TARGET NAME: |
|---|---|
| GOING_UP | ELEVATOR POSITION |
| GOING_DOWN | ELEVATOR POSITION |

| | |
|---|---|
| NAME OF RULES THAT INTERROGATE | : UP PICK-UP<br>DOWN PICK-UP<br>DETERMINE DIRECTION<br>PASSENGER TRAVEL |
| NAME OF RULES THAT MODIFY | : RESET FLOOR REQUESTS<br>SET FLOOR REQUESTS |
| NAME OF RULES THAT DEFINE | : DEFINE FLOOR REQUESTS |

FIG. 21

RULE: DEFINE ELEVATOR POSITION

| | |
|---|---|
| FUNCTIONAL RULE NAME (UNIQUE IDENTIFIER) | : DEFINE ELEVATOR POSITION |
| COMPLETENESS INDICATOR (YES OR NO) | : YES |
| NAME OF OWNING SYSTEM | : ELEVATOR |
| FUNCTIONAL RULE TYPE (STATIC OR DYNAMIC) | : STATIC |

ACTION(1)

CONDITION: ALWAYS

RULES INVOKED:                  NONE

DEFINITION OR MODIFICATION       GOING_UP AND GOING_DOWN CANNOT
    OF INFORMATION ENTITIES:          BOTH BE ON AT THE SAME TIME.
                                                 VALID VALUES FOR NUMBER_FLOOR_
                                                 CURRENT ARE FROM 1 TO FLOORMAX.

NAME OF CREATED TRANSACTIONS:    NONE

CONTINUATION INDICATOR:          CONTINUE
END_OF_ACTION(1)

| | |
|---|---|
| TRANSACTION(S) THAT TRIGGER | : NONE |
| TRANSACTION(S) CREATED | : NONE |
| INFORMATION ENTITIES/INTERROGATED DEPENDENCIES/ | : NONE |
| INFORMATION ENTITIES/MODIFIED DEPENDENCIES/ | : NONE |
| INFORMATION ENTITIES/DEFINED DEPENDENCIES/ | : ELEVATOR POSITION GOING_UP AND GOING_DOWN |
| RULES INVOKED | : NONE |

FIG. 22

RULE: DEFINE FLOOR REQUESTS

| | |
|---|---|
| FUNCTIONAL RULE NAME (UNIQUE IDENTIFIER) | : DEFINE FLOOR REQUESTS |
| COMPLETENESS INDICATOR (YES OR NO) | : YES |
| NAME OF OWNING SYSTEM | : ELEVATOR |
| FUNCTIONAL RULE TYPE (STATIC OR DYNAMIC) | : STATIC |

ACTION(1)

CONDITION: ALWAYS

RULES INVOKED:                NONE

DEFINITION OR MODIFICATION      NUMBER_FLOOR MUST BE BETWEEN
   OF INFORMATION ENTITIES:         1 AND FLOORMAX.
                                                 A GIVEN FLOOR MAY HAVE ALL THREE
                                                 SIGNALS ON AT THE SAME TIME.
                                                 THE ELEVATOR IS QUIESCED IF ALL
                                                 SIGNALS ARE OFF FOR ALL FLOORS.

NAME OF CREATED TRANSACTIONS:     NONE

CONTINUATION INDICATOR:           CONTINUE

END_OF_ACTION(1)

| | |
|---|---|
| TRANSACTION(S) THAT TRIGGER | : NONE |
| TRANSACTION(S) CREATED | : NONE |
| INFORMATION ENTITIES/INTERROGATED   DEPENDENCIES/ | : NONE |
| INFORMATION ENTITIES/MODIFIED   DEPENDENCIES/ | : NONE |
| INFORMATION ENTITIES/DEFINED   DEPENDENCIES/ | : FLOOR REQUESTS |
| RULES INVOKED | : NONE |

FIG. 23

RULE: SET FLOOR REQUESTS

| | |
|---|---|
| FUNCTIONAL RULE NAME (UNIQUE IDENTIFIER) | : SET FLOOR REQUESTS |
| COMPLETENESS INDICATOR (YES OR NO) | : YES |
| NAME OF OWNING SYSTEM | : ELEVATOR |
| FUNCTIONAL RULE TYPE (STATIC OR DYNAMIC) | : DYNAMIC |

ACTION(1)

CONDITION: ALWAYS

| | |
|---|---|
| RULES INVOKED: | NONE |
| DEFINITION OR MODIFICATION OF INFORMATION ENTITIES: | TURN SIGNALS ON FOR THE PROPER FLOOR. THE SIGNALS ARE: GO_TO_FLOOR, REQUEST_DOWN AND REQUEST_UP. |
| NAME OF CREATED TRANSACTIONS: | DISPLAY STATE |
| CONTINUATION INDICATOR: | CONTINUE |

END_OF_ACTION(1)

| | |
|---|---|
| TRANSACTION(S) THAT TRIGGER | : PRESS FLOOR-INTERNAL BUTTON |
| TRANSACTION(S) CREATED | : DISPLAY STATE |
| INFORMATION ENTITIES/INTERROGATED DEPENDENCIES/ | : NONE |
| INFORMATION ENTITIES/MODIFIED DEPENDENCIES/ | : FLOOR REQUESTS |
| INFORMATION ENTITIES/DEFINED DEPENDENCIES/ | : NONE |
| RULES INVOKED | : NONE |

FIG. 24

RULE: RESET FLOOR REQUESTS

| | |
|---|---|
| FUNCTIONAL RULE NAME (UNIQUE IDENTIFIER) | : RESET FLOOR REQUESTS |
| COMPLETENESS INDICATOR (YES OR NO) | : YES |
| NAME OF OWNING SYSTEM | : ELEVATOR |
| FUNCTIONAL RULE TYPE (STATIC OR DYNAMIC) | : DYNAMIC |

ACTION(1)

CONDITION: ALWAYS

| | |
|---|---|
| RULES INVOKED: | NONE |
| DEFINITION OR MODIFICATION OF INFORMATION ENTITIES: | TURN SIGNALS OFF FOR THE PROPER FLOOR. THE SIGNALS ARE: GO_TO_FLOOR, REQUEST_DOWN AND REQUEST_UP. |
| NAME OF CREATED TRANSACTIONS: | DISPLAY STATE |
| CONTINUATION INDICATOR: | CONTINUE |

END_OF_ACTION(1)

| | |
|---|---|
| TRANSACTION(S) THAT TRIGGER | : STOP, OPEN, AND CLOSE DOOR |
| TRANSACTION(S) CREATED | : DISPLAY STATE |
| INFORMATION ENTITIES/INTERROGATED DEPENDENCIES/ | : NONE |
| INFORMATION ENTITIES/MODIFIED DEPENDENCIES/ | : FLOOR REQUESTS |
| INFORMATION ENTITIES/DEFINED DEPENDENCIES/ | : NONE |
| RULES INVOKED | : NONE |

FIG. 25

RULE: UP PICK-UP

| | |
|---|---|
| FUNCTIONAL RULE NAME (UNIQUE IDENTIFIER) | : UP PICK-UP |
| COMPLETENESS INDICATOR (YES OR NO) | : YES |
| NAME OF OWNING SYSTEM | : ELEVATOR |
| FUNCTIONAL RULE TYPE (STATIC OR DYNAMIC) | : DYNAMIC |

ACTION(1)
   CONDITION: THE ELEVATOR IS GOING UP AND LOWER OR AT THE PICK-UP FLOOR OR THE ELEVATOR IS GOING DOWN AND HIGHER OR AT THE PICK-UP FLOOR AND THERE IS A REQUEST TO STOP THERE
   RULES INVOKED: SET FLOOR REQUESTS
   DEFINITION OR MODIFICATION OF INFORMATION ENTITIES: NONE
   NAME OF CREATED TRANSACTIONS: STOP, OPEN, AND CLOSE DOOR
   CONTINUATION INDICATOR: CONTINUE
END_OF_ACTION(1)

ACTION(2)
   CONDITION: THE ELEVATOR IS GOING DOWN AND HIGHER THAN THE PICK-UP FLOOR AND THERE IS NO REQUEST TO STOP THERE
   RULES INVOKED: SET FLOOR REQUESTS
   DEFINITION OR MODIFICATION OF INFORMATION ENTITIES: NONE
   NAME OF CREATED TRANSACTIONS: PASS-BY WITHOUT STOPPING
   CONTINUATION INDICATOR: CONTINUE
END_OF_ACTION(2)

| | |
|---|---|
| TRANSACTION(S) THAT TRIGGER | : PRESS UP-EXTERNAL BUTTON |
| TRANSACTION(S) CREATED | : STOP, OPEN, AND CLOSE DOOR<br>PASS-BY WITHOUT STOPPING |
| INFORMATION ENTITIES/INTERROGATED DEPENDENCIES/ | : ELEVATOR POSITION<br>FLOOR REQUESTS<br>GOING_UP AND GOING_DOWN |
| INFORMATION ENTITIES/MODIFIED - DEPENDENCIES/ | : NONE |
| INFORMATION ENTITIES/DEFINED DEPENDENCIES/ | : NONE |
| RULES INVOKED | : SET FLOOR REQUESTS |

FIG. 26

RULE: DOWN PICK-UP

| | |
|---|---|
| FUNCTIONAL RULE NAME (UNIQUE IDENTIFIER) | : DOWN PICK-UP |
| COMPLETENESS INDICATOR (YES OR NO) | : YES |
| NAME OF OWNING SYSTEM | : ELEVATOR |
| FUNCTIONAL RULE TYPE (STATIC OR DYNAMIC) | : DYNAMIC |

ACTION(1)
   CONDITION:   THE ELEVATOR IS GOING DOWN AND HIGHER OR AT THE PICK-UP FLOOR    OR
                       THE ELEVATOR IS GOING UP AND LOWER OR AT THE PICK-UP FLOOR AND THERE IS A REQUEST TO STOP THERE
   RULES INVOKED:    SET FLOOR REQUESTS
   DEFINITION OR MODIFICATION OF INFORMATION ENTITIES:    NONE
   NAME OF CREATED TRANSACTIONS:    STOP, OPEN, AND CLOSE DOOR
   CONTINUATION INDICATOR:    CONTINUE
END_OF_ACTION(1)

ACTION(2)
   CONDITION:    THE ELEVATOR IS GOING UP AND LOWER OR AT THE PICK-UP FLOOR AND THERE IS NO REQUEST TO STOP THERE
   RULES INVOKED:    SET FLOOR REQUESTS
   DEFINITION OR MODIFICATION OF INFORMATION ENTITIES:    NONE
   NAME OF CREATED TRANSACTIONS:    PASS-BY WITHOUT STOPPING
   CONTINUATION INDICATOR:    CONTINUE
END_OF_ACTION(2)

| | |
|---|---|
| TRANSACTION(S) THAT TRIGGER | : PRESS DOWN-EXTERNAL BUTTON |
| TRANSACTION(S) CREATED | : STOP, OPEN, AND CLOSE DOOR<br>PASS-BY WITHOUT STOPPING |
| INFORMATION ENTITIES/INTERROGATED DEPENDENCIES/ | : ELEVATOR POSITION<br>FLOOR REQUESTS<br>GOING_UP AND GOING_DOWN |
| INFORMATION ENTITIES/MODIFIED DEPENDENCIES/ | : NONE |
| INFORMATION ENTITIES/DEFINED DEPENDENCIES/ | : NONE<br>FLOOR REQUESTS |
| RULES INVOKED | : SET FLOOR REQUESTS |

FIG. 27A

RULE: PASSENGER TRAVEL

```
FUNCTIONAL RULE NAME (UNIQUE IDENTIFIER)    : PASSENGER TRAVEL
COMPLETENESS INDICATOR (YES OR NO)          : YES
NAME OF OWNING SYSTEM                       : ELEVATOR
FUNCTIONAL RULE TYPE (STATIC OR DYNAMIC)    : DYNAMIC
```

ACTION(1)

CONDITION:     ELEVATOR DIRECTION AND PASSENGER DIRECTION COINCIDE AND THERE ARE NO REQUIRED STOPS IN BETWEEN

RULES INVOKED:     NONE

DEFINITION OR MODIFICATION OF INFORMATION ENTITIES:     NONE

NAME OF CREATED TRANSACTIONS:     PASS-BY WITHOUT STOPPING
                                                     STOP, OPEN, AND CLOSE DOOR

CONTINUATION INDICATOR:     CONTINUE

END_OF_ACTION(1)

ACTION(2)

CONDITION:     ELEVATOR DIRECTION AND PASSENGER DIRECTION COINCIDE AND THERE ARE NO REQUIRED STOPS IN BETWEEN

RULES INVOKED:     NONE

DEFINITION OR MODIFICATION OF INFORMATION ENTITIES:     NONE

NAME OF CREATED TRANSACTIONS:     STOP, OPEN, AND CLOSE DOOR

CONTINUATION INDICATOR:     CONTINUE

END_OF_ACTION(2)

FIG. 27B

RULE: PASSENGER TRAVEL (CONTINUED)

| | |
|---|---|
| ACTION(3) | |
|   CONDITION: | ELEVATOR DIRECTION AND PASSENGER DIRECTION DO NOT COINCIDE. |
|   RULES INVOKED: | DETERMINE DIRECTION |
|   DEFINITION OR MODIFICATION OF INFORMATION ENTITIES: | NONE |
|   NAME OF CREATED TRANSACTIONS: | NONE |
|   CONTINUATION INDICATOR: | CONTINUE |
| END_OF_ACTION(3) | |
| TRANSACTION(S) THAT TRIGGER | : PRESS FLOOR-INTERNAL BUTTON |
| TRANSACTION(S) CREATED | : STOP, OPEN, AND CLOSE DOOR<br>PASS-BY WITHOUT STOPPING |
| INFORMATION ENTITIES/INTERROGATED DEPENDENCIES/ | : ELEVATOR POSITION<br>FLOOR REQUESTS<br>GOING_UP AND GOING_DOWN |
| INFORMATION ENTITIES/MODIFIED DEPENDENCIES/ | : NONE |
| INFORMATION ENTITIES/DEFINED DEPENDENCIES/ | : NONE |
| RULES INVOKED | : DETERMINE DIRECTION |

FIG. 28A

RULE: DETERMINATION DIRECTION

| | |
|---|---|
| FUNCTIONAL RULE NAME (UNIQUE IDENTIFIER) | : DETERMINE DIRECTION |
| COMPLETENESS INDICATOR (YES OR NO) | : YES |
| NAME OF OWNING SYSTEM | : ELEVATOR |
| FUNCTIONAL RULE TYPE (STATIC OR DYNAMIC) | : DYNAMIC |

ACTION(1)

CONDITION: GOING_UP IS ON AND THERE ARE NO REQUESTS FOR HIGHER FLOORS

RULES INVOKED: NONE

DEFINITION OR MODIFICATION OF INFORMATION ENTITIES: SET GOING_UP TO OFF

NAME OF CREATED TRANSACTIONS: NONE

CONTINUATION INDICATOR: CONTINUE

END_OF_ACTION(1)

ACTION(2)

CONDITION: GOING_DOWN IS ON AND THERE ARE NO REQUESTS FOR LOWER FLOORS

RULES INVOKED: NONE

DEFINITION OR MODIFICATION OF INFORMATION ENTITIES: SET GOING_DOWN TO OFF

NAME OF CREATED TRANSACTIONS: NONE

CONTINUATION INDICATOR: CONTINUE

END_OF_ACTION(2)

FIG. 28B
RULE: DETERMINE DIRECTION (CONTINUED)

```
ACTION(3)
   CONDITION:        GOING_UP AND GOING_DOWN ARE BOTH OFF AND THERE IS A
                     REQUEST FOR A FLOOR LOWER THAN NUMBER_FLOOR_CURRENT.
   RULES INVOKED:                     NONE
   DEFINITION OR MODIFICATION         SET GOING_DOWN TO ON
   OF INFORMATION ENTITIES:
   NAME OF CREATED TRANSACTIONS:      NONE
   CONTINUATION INDICATOR:            CONTINUE
END_OF_ACTION(3)
ACTION(4)
   CONDITION:        GOING_UP AND GOING_DOWN ARE BOTH OFF AND THERE IS A
                     REQUEST FOR A FLOOR HIGHER THAN NUMBER_FLOOR_CURRENT.
   RULES INVOKED:                     NONE
   DEFINITION OR MODIFICATION         SET GOING_UP TO ON
   OF INFORMATION ENTITIES:
   NAME OF CREATED TRANSACTIONS:      NONE
   CONTINUATION INDICATOR:            CONTINUE
END_OF_ACTION(4)
```

| | |
|---|---|
| TRANSACTION(S) THAT TRIGGER | : STOP, OPEN, AND CLOSE DOOR |
| TRANSACTION(S) CREATED | : NONE |
| INFORMATION ENTITIES/INTERROGATED DEPENDENCIES/ | : ELEVATOR POSITION<br>FLOOR REQUESTS<br>GOING_UP AND GOING_DOWN |
| INFORMATION ENTITIES/MODIFIED DEPENDENCIES/ | : GOING_UP AND GOING_DOWN |
| INFORMATION ENTITIES/DEFINED DEPENDENCIES/ | : NONE |
| RULES INVOKED | : NONE |

FIG. 29

DATA ELEMENT DICTIONARY

| | |
|---|---|
| GOING_DOWN | (DEPENDENCY CONNECTION INDICATING THAT THE CURRENT DIRECTION OF ELEVATOR TRAVEL IS DOWN) |
| GOING_UP | (DEPENDENCY CONNECTION INDICATING THAT THE CURRENT DIRECTION OF ELEVATOR TRAVEL IS UP) |
| NUMBER_FLOOR | (FLOOR AT WHICH AN EXTERNAL BUTTON WAS PRESSED - DETECTED JOINTLY WITH SIGNAL UP OR DOWN) |
| NUMBER_FLOOR_CURRENT | (FLOOR AT WHICH THE ELEVATOR CURRENTLY IS) |
| SIGNAL_GO_TO_FLOOR | (FLOOR BUTTON PRESSED INSIDE ELEVATOR) |
| SIGNAL_REQUEST_DOWN | (DOWN BUTTON PRESSED OUTSIDE ELEVATOR - COMBINED WITH NUMBER_FLOOR) |
| SIGNAL_REQUEST_UP | (UP BUTTON PRESSED OUTSIDE ELEVATOR - COMBINED WITH NUMBER_FLOOR) |

DEPENDENCIES BETWEEN INFORMATION ENTITIES

TRANSACTION EVENTS FOR PRESS UP-EXTERNAL BUTTON

TRANSACTION EVENTS FOR PRESS FLOOR-INTERNAL BUTTON

TOOL FOR DEFINING COMPLEX SYSTEMS

BACKGROUND OF THE INVENTION

1. Field of the Invention

This invention relates to apparatus and methods for interactively defining and examining complex system functions. More particularly, the present invention is a computer resident tool which interacts with a user who is allowed to enter and validate data about a system, and then manipulate and present it in formats useful to the user.

2. Description of the Prior Art

The final users, or purchasers, of a system usually do not care very much about the internal construction of the system, but rather want particular external functions in response to information or commands entered by the users. Today there are no tools or methods that allow description of the functions of a system from the external point of view. All tools that attempt this fall into the trap of describing the internal workings of the system, and hope that the user infers the system's external functioning. The result is that, especially in relation to computer-based systems, users or owners of systems approve specifications that they do not understand, leading to the construction of systems that do not satisfy their requirements.

The main problem which has not been solved is recording, management and, particularly, presentation of the functional rules which control the system. Such functional rules are very numerous in typical systems, and the user must be able to analyze and understand the rules and how they relate to the outside world. A tool for defining the external functions of a system is necessary for understanding existing systems before modifying them, and for specifying the function of new systems.

The present invention solves the problem of understanding and specifying systems according to their external functions by structuring the functions in terms of transactions between the system and a potential system user, functional rules, and information entities which register information about the outside world in the system. It also validates the entered data and presents it in formats useful to the user.

SUMMARY OF THE INVENTION

This invention is a tool embodied in a computer as software, hardware, microcode, etc. The tool comprises means for creating a specification of a system in terms of external functions of the system. The specification is a model of the function of the system. The system could be an application program, such as a business application program; e.g., accounting systems, timekeeping, personnel, or a complex electrical/mechanical system.

The specification comprises a representation of transactions, functional rules, information entities, and interconnections between the transactions, rules and information entities of the system. Transactions represent interactions between a system and a system user. The functional rules represent all of the expected results of a transaction independently of the means of achieving the expected result. The information entities represent the state of the system, including all of the attributes necessary to define the system in terms of its external functions.

The tool further comprises means for receiving input for assessing the completeness of the specification, and for presenting to the user of the tool a view of the current state of the system in terms of the system user's external interface to the system.

The purposes of this tool are to facilitate the entry and validation of information about a system, and to present meaningful views of the system to the user in response to queries from a user. The tool itself can be used as a contract between the potential buyer of the system and the developer of the system prior to development, or purchase, of the actual system. This eliminates the construction of systems, or components of the system, that do not satisfy the requirements of the user.

Another purpose of this tool is to provide the analysis results of the system to the designer developing the system.

Another purpose of this tool is to act as the source of test cases for the system once the system has been developed.

Those having normal skill in the art will recognize the foregoing and other objects, features, advantages, and applications of the present invention from the following, more detailed description of the preferred embodiments as illustrated in the accompanying drawings.

BRIEF DESCRIPTION OF THE DRAWINGS

FIG. 13 shows an interactive display of the transaction PRESS UP-EXTERNAL BUTTON.

FIG. 14 shows an interactive display of the transaction PRESS DOWN-EXTERNAL BUTTON.

FIG. 15 shows an interactive display of the transaction PRESS FLOOR-INTERNAL BUTTON.

FIG. 16 sows an interactive display of the transaction DISPLAY STATE.

FIG. 17 shows an interactive display of the transaction STOP, OPEN, AND CLOSE DOOR.

FIG. 18 shows an interactive display of the transaction PASS-BY WITHOUT STOPPING.

FIG. 19 shows an interactive display of the information entity ELEVATOR POSITION.

FIG. 20 shows an interactive display of the information entity FLOOR REQUESTS.

FIG. 21 shows an interactive display of the functional rule DEFINE ELEVATOR POSITION.

FIG. 22 shows an interactive display of the rule DEFINE FLOOR REQUESTS.

FIG. 23 shows an interactive display of the rule SET FLOOR REQUESTS.

FIG. 24 shows an interactive display of the rule RESET FLOOR REQUESTS.

FIG. 25 shows an interactive display of the rule UP PICK-UP.

FIG. 26 shows an interactive display of the rule DOWN PICK-UP.

FIGS. 27A–B show an interactive display of the rule PASSENGER TRAVEL.

FIGS. 28A–B show an interactive display of the rule DETERMINE DIRECTION.

FIG. 29 shows a data element dictionary.

DETAILED DESCRIPTION OF THE PREFERRED EMBODIMENTS

Figure 1:
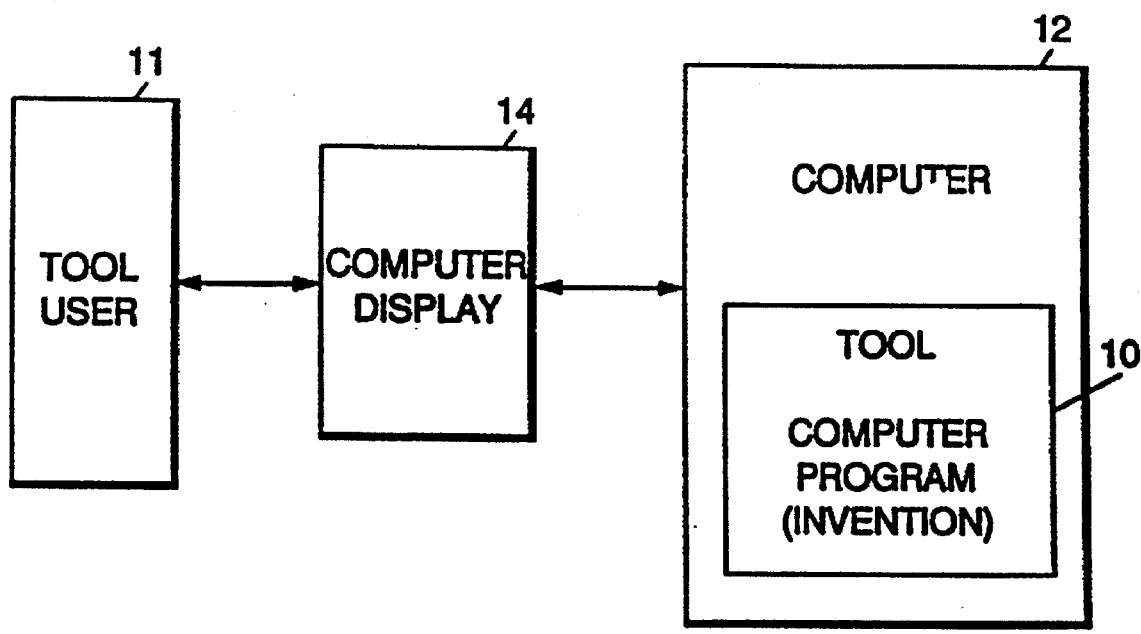
FIG. 1 is a block diagram showing the present invention resident in a computer interfaced to a user.

FIG. 1 shows the invention, a system definition tool 10, resident in a computer 12 and interfaced to display 14. In the preferred embodiment, the tool 10 is a computer program that executes in a computer 12, and interacts with a user 11 through a computer display 14, such as a terminal. Tool 10 may also be hard wired or microcode.

Tool 10 allows the user to enter information, validate his/her inputs, and ask questions about the stored information. Typical users are business professionals (analysts), information systems personnel and various types of managers.

Tool 10 operates to allow the specification of complex system functions from the external, or user point of view. It does not address design, or constructive details but instead keeps track of functions relevant from an external viewpoint. It specifies system functioning rather than system design or implementation.

Figure 2:
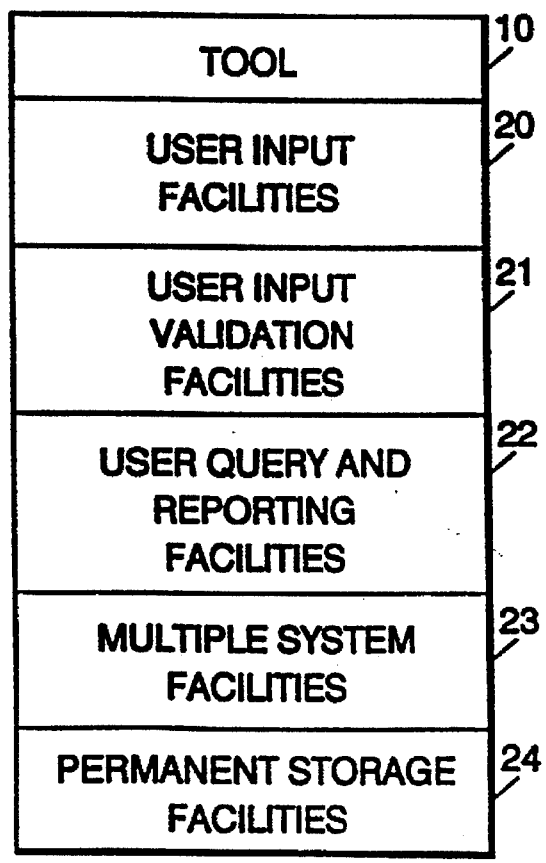
FIG. 2 shows the facilities of the present invention.

FIG. 2 shows the facilities of tool 10, which operates on computer 12. In general, a tool user 11 will enter relevant functional data about the system via display, or terminal, 14 into the user input facilities 20. Tool 10 validates the inputs, both as they are entered and globally when entry is complete, via the user input validation facilities 21. The user then has the option of validating and exploring the system definition created by tool 10 by requesting reports in list, or flowchart format, showing the system interactions via the user query and reporting facilities 22. Tool 10 has the capacity to simultaneously specify more than one system, and the interactions between them through the multiple system facilities 23. Permanent storage of user input is accomplished via the permanent storage facilities 24.

Figure 3:
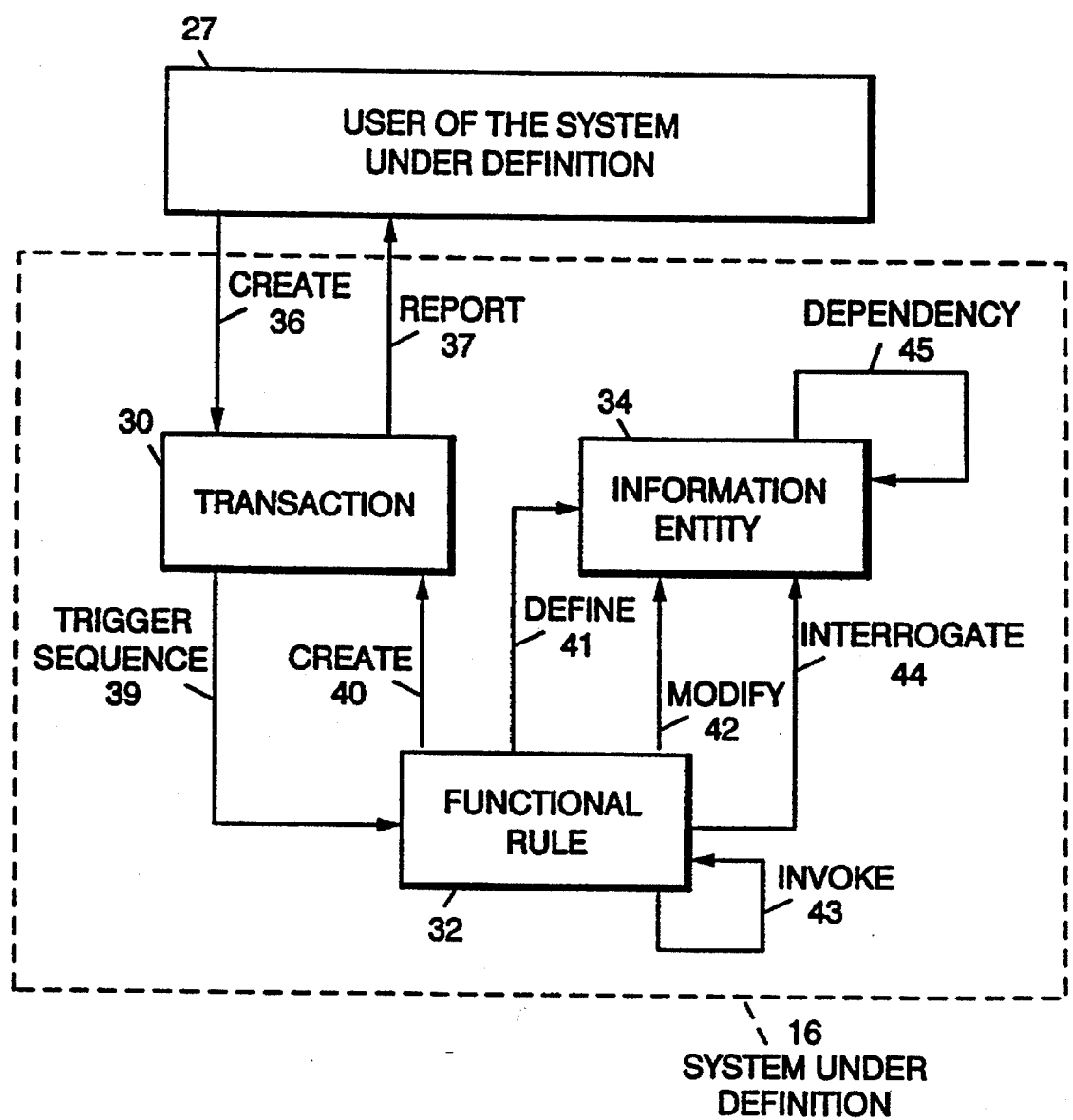
FIG. 3 is a block diagram showing the structure within which the tool defines a system, and the interface between the invention and the user.

FIG. 3 shows a view of the structure within which a system 16 is defined or specified by tool 10. Tool 10 guides tool user 11 in creating a structured functional specification of a system. The structured view (which could be called a meta-model) is presented and enforced by the tool 10 through the inputs permitted and validation by input validation facilities 21, shown in FIG. 2. The modules 30, 32, and 34 are components within the structure or meta-model, and the arrows 36, 37, and 39 through 45 are interfaces, or connections, between the source component and the target component. Components can interface with other components of the same type. These interactions are shown as loops 43 and 45. The arrow points to the target component in each case.

User 27 is a hypothetical user of the system, and is shown to indicate that transaction 30 is the only component that is externally visible to the user 27. System 16 allows user 27 to create transactions via connection 36 and receive report transactions via connection 37.

The user 27 assembles a transaction 30 by placing in a logical sequence the one or more data elements that compose the transaction being created. Once a transaction 30 is assembled, it is presented to system 16 for processing. Similarly, create connection 40 is exercised by a functional rule 32 with another transaction 30 as the target. Functional rule 32 assembles the data elements of transaction 30, and presents that transaction 30 as report 37 to user 27. Thus, users 27 and rules 32 can both create transactions 30.

Report connection 37 indicates that the source, transaction 30, is presented by system 16 with the data elements that compose transaction 30, and passes it along to user 27. Since tool user 27 is external to the system, no assumption is made as to what user 27 could do with the received transaction 30.

The tool user 11 in FIG. 1 who specifies a system's functions is primarily interested in the functional conditions that cause a given transaction 30 to be received by system user 27. System users have systems in order to receive their outputs (meaning the work or results produced by the system) and, in order to get those results, users are required to input information to keep the system up to date.

There are three types of transactions 30. Queries are transactions created by the user 27 which ask questions about the internal state of system 16's information. Reports are transactions reported to the user 27 (created by a functional rule 32) as output from system 16. Event notifications are transactions created by user 27 which notify system 16 that some external event has occurred that system 16 has to account for.

Functional rules 32 are specifications of the functioning of the system under study. They can be of two types, static and dynamic. Static rules define the attributes of data elements 50, and dependencies 45 of information entities 34. The conditions which must be satisfied for the rule to operate are always true, so that the rule always operates. Dynamic rules specify processes that the system 16 follows under determined conditions. This type of rule is activated by transactions 30 through the trigger sequence connection 39. Trigger sequence connection 39 indicates that when a transaction 30 is created by user 27 and received by system 16, it will trigger one or more functional rules 32. Rules 32 may also invoke 43 other rules. Rules 32 may interrogate 44, or modify 42 information entities 34.

Figure 4:
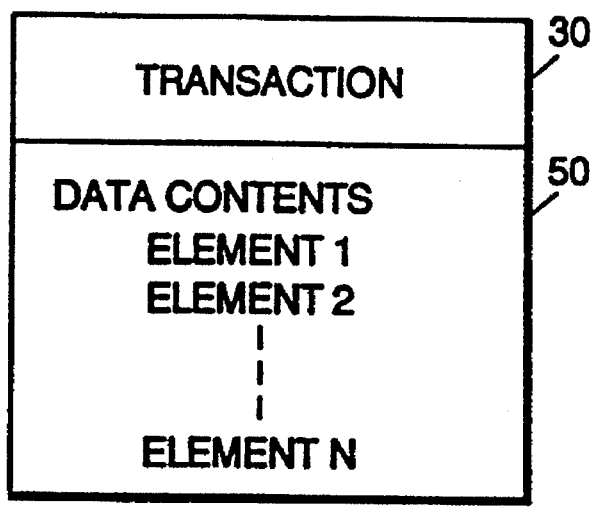
FIG. 4 shows the data structure of a transaction.

FIG. 4 shows the basic contents of a transaction 30. The main components of transactions 30 are data elements 50.

Data elements 50 are place holders for data values that represent real world facts. A transaction 30 may have zero, or more, data elements 50.

Figure 6:
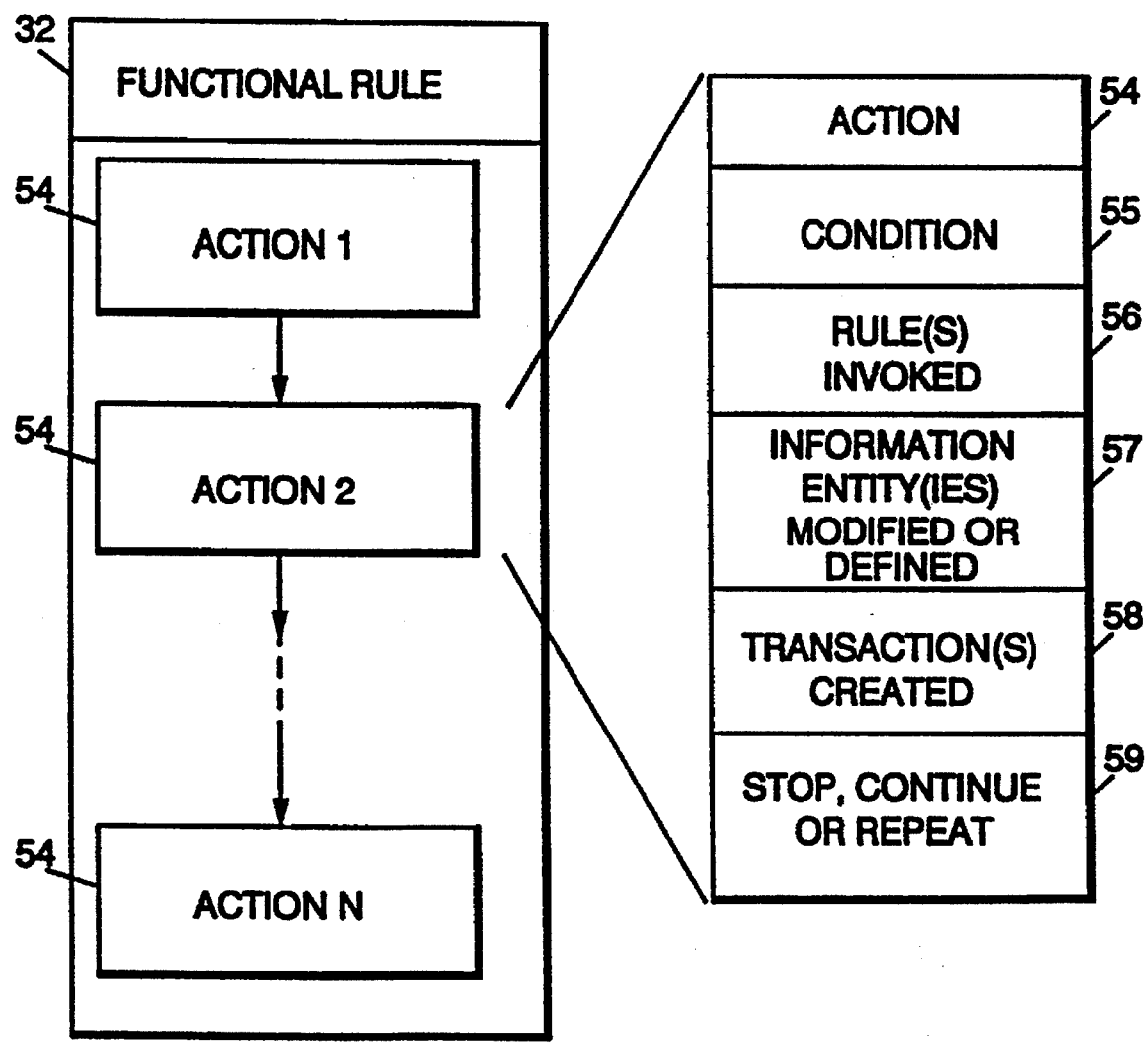
FIG. 6 shows the data structure of a functional rule.

FIG. 6 shows the structure and contents of a functional rule 32. A functional rule 32 is composed of a sequence of one or more actions 54, each of which has a condition 55. Each action 54 whose condition 55 is true is executed in sequence. The entire sequence of actions 54 will be exercised if each action's condition 55 is true, unless some action 54 in the sequence has a STOP indicator as its continuity indicator 59.

Each action 54 contains a condition 55, which is an expression in terms of the contents of data elements 50 contained within transactions 30, and/or the contents of the one or more information entities' 34 data elements 50 or dependencies 52. If the expression is true, then the action 54 is executed. Otherwise, the condition 55 of the next action 54 is tested, or the rule 32 ends if there are no more actions 54 in its definition. The information entities 34 that are used in condition 55 are said to be interrogated by connection 44 by a functional rule 32.

Each action 54 contains a list 56 of zero, or more, functional rules 32 that are invoked. This feature helps avoid the re-specification of rules 32 that apply under many situations. Each action also contains a list 57 indicating changes to be made to one or more data elements 50, or dependencies 52 in one or more information entities 34. Referring to FIG. 3, this operation is recorded through the modify connection 42. Each action 54 may also create transactions 30 to be sent to user 27 through create connection 40.

Figure 5:
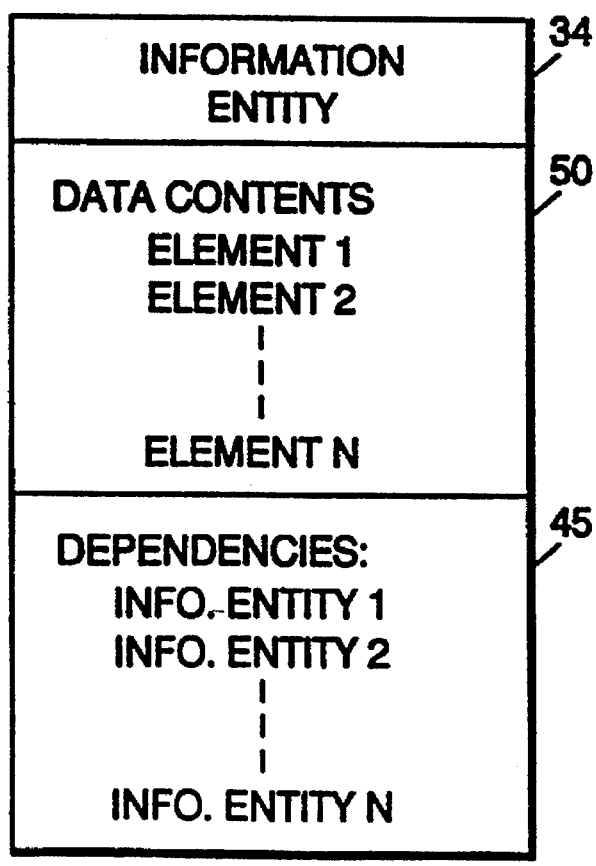
FIG. 5 shows the data structure of an information entity.

Information entities 34 are internal memories that system 16 needs to keep to operate properly. They account for the fact that system 16 must keep up-to-date information about events and changes which occur in the system under study. As shown in FIG. 5, information entities 34 are composed of data elements 50 and dependencies 52. Data elements 50 in information entities 34 are conceptually the same as those comprising transactions 30. Dependencies 45 represent the fact that information entities 34 depend on each other as recorded through dependency connection 45. These dependencies 45 reflect the relationship between states and events in the system under study.

Information entities 34 keep track of the cumulative effects of past transactions 30. Information entities 34 are of two types, descriptors and transaction logs. Descriptors are information entities that represent external (real world) objects, or concepts, that the system 16 manipulates. They are called descriptors because they describe, in system terms, some external entity. Their task is to keep a reflection within the system of the state of the corresponding real world object. Event notification transactions 30 represent the mechanism that triggers the updating of recording entities through specifications in rules 32. Transaction logs are information entities 34 whose task is to keep track of past events. In this case, they keep images of past transactions 30, if they are needed for future reference.

Information entities 34 are not intended to be true reflections of an implementation of the system under study, but rather logical requirements that the system should satisfy. The requirements can be inferred by typical data design techniques.

Rules 32 can modify 42, interrogate 44, or define 41 information entities 34. A rule 32 modifies an information entity 34 through connection 42 by altering the values of some of the data elements 50 and/or dependencies 45 that compose it. A rule 32 interrogates an information entity 34 through connection 44 by retrieving the values of data elements 50 and dependencies 45 contained in information entity 34 in order to make the decisions needed to guide the operation of rule 32. A rule 32 defines an information entity 34 through connection 41 by specifying permitted values of data elements 50 and dependencies 52. Rules 32, which define information entities 34, are static rules, assumed to be true at all times. They are axiomatic statements about attributes of data elements and dependencies which the user enters.

The dependency connection 45, shown in FIGS. 3 and 5, represents a relationship between two information entities 34. Information entities may be connected to zero or more other information entities in this manner. The dependency connection 45 means that the real-world objects represented by the participating information entities are connected, also in the real world.

Returning to FIG. 2, one facility of tool 10 is the user input facility 20. The main function of user input facility 20 is to allow the user 11 of tool 10 to enter information according to the structure shown in FIG. 3. The tool allows entry of instances of components (transactions 30, information entities 34, and functional rules 32) and connections (dependency 45, trigger sequence 39, create 40, define 41, modify 42, and interrogate 44). The connections from user 27 to transaction 30—create 36 and report 37—are not entered by the user 27, but rather are kept as attributes of transaction 30.

The basic contents and structure of transaction 30 are shown in FIG. 4. Additional useful data may also be entered, including:

Transaction Name.
Completeness indicator (yes, no).
Name of owning system.
Transaction Type (event notification, query or report)
Created by (user 36 or system 37).
Logged (yes or no)—this is an indication that specifies the requirement of having an information entity of type transaction log.
Name of system this transaction is sent to—this is an indication that this transaction goes to another system. A null value in this attribute means that the transaction does not go to another system.
List of data elements 50.
Trigger sequence—sequence of functional rule 32 names, to support the trigger sequence connection 39.
Rules that create—list of functional rules 32 that create this transaction 30, to support the create connection 40 from rule 32.

The basic contents and structure of information entity 34 are shown in FIG. 5. Additional useful data which may be entered includes:

Information Entity name.
Completeness indicator (yes, no).
Name of owning system.
Information entity type (descriptor or transaction log).
List of data elements 50.
List of names and sources/targets of all dependency connections 45 with other Information Entities 34, to support the corresponding connection.
List of names of the Functional Rules 32 that interrogate 44 this Information Entity.
List of names of the Functional Rules 32 that modify 42 this Information Entity.
List of names of the Functional Rules 32 that define 41 this Information Entity.

The basic contents and structure of functional rule 32 are shown in FIG. 6. Additional data which may be entered includes:

Functional Rule name.
Completeness indicator (yes, no).
Name of owning system.
Functional Rule type (static, dynamic).
Sequence of one or more actions 54, and for each action:
  Condition 55 (either ALWAYS or some expression in free form denoting the condition) for this action.
  List 56 of names of other Functional Rules 32 invoked by this action.
  Expression 57 indicating the Definition or Modification of one or more Information Entities for this action.
  Sequence of names 58 of the transactions 30 created by this action.

Continuation indicator 59 (stop, continue, or repeat) for this action.

The following is a summary of characteristics at the functional rule level needed to support the connections caused by the aggregation of all of its actions:

List of the names of Transactions 30 that trigger 39 this rule.

List of the names of all transactions 30 created 40 by this rule.

List of the names of all information entities 34 modified 42 by this rule.

List of the names of all information entities 34 interrogated 44 by this rule.

List of the names of all information entities 34 defined by this rule.

The tool user 11 is prompted by tool 10 in a user friendly way to enter the mentioned information through display 14. During input, the user may see views of the data, as described in the query and reporting facilities section that follows. Tool 10 validates input through the user input validation facilities 21 as it is being entered, and after some completion level is reached, as explained in the next section. The entry of the information at the component level is preferably done utilizing fill-in-the-blanks forms at display 14.

User validation facilities 21 validate data as it is entered and globally after entry is completed. When the tool user 11 is involved in the entry of information, the overall information may be inconsistent because of error, or because all of the data needed is not available. This is a normal condition. In the preferred embodiment, the validation facilities 21 operate at different levels, called the individual level and the global level.

The individual level operates as data is entered for the main three components shown in the structured view of FIG. 3 (transactions 30, rules 32, and information entities 34). When tool user 11 completes definition or modification of a first component, and requests to move to a second component, the data for the first component is tested for existence of all of its basic elements, and the user 27 notified if some are missing. If a basic component is missing, the definition or modification can still take effect, but the user cannot set the completeness indicator to yes.

The global level of validation is requested by tool user 11 when ready to review his/her work. In the preferred embodiment, the validation facilities 21 of tool 10 are capable of producing the following reports:

List of all transactions 30 that are not completed.

List of all information entities 34 that are not completed.

List of all functional rules 32 that are not completed.

List of all transactions 30 that do not trigger 39 any rules 32.

List of all transactions 30 that trigger rules that are not defined (a rule name in the Trigger Sequence in the transaction definition does not match the name of a defined rule).

List of all information entities 34 that show a dependency 45 source or target information entity that is undefined.

List of all information entities 34 that list undefined rules as interrogating 44 the information entities 34.

List of all information entities 34 that list undefined rules as modifying 42 them.

List of all information entities 34 that list undefined rules as defining 41 them.

List of all transactions 30 listed by some rule 32 as triggering 39 the rule 32 that are undefined.

List of all transactions 30 listed by some rule 32 as being created by it that are undefined.

List of all information entities 34 listed by some rule 32 as being modified 42 by it that are undefined.

List of all information entities 34 listed by some rule 32 as being interrogated 44 by it that are undefined.

List of all information entities 34 listed by some rule 32 as being defined 41 by it that are undefined.

The lists produced by the validation facilities 21 consist of component names. Through a tool user 11 selection, the definition of a component of one of the above lists is shown to the user 11 for additional analysis. Users 11 may have valid reasons for considering a system's functional definition finished even if some of the above lists are not empty (indicating a model which is not fully consistent).

Validation facilities 21 also have the ability to check all of the inconsistencies mentioned above, and produce a summary report.

User input query and reporting facilities 22 allow user 27 to determine the contents of any component and its connections. Even though queries and reports can be obtained at any time, generally queries are used to examine the consistency of the model or portions of the model. In some sense, the reports shown in the validation section are also queries, except that there the intent is to correct incomplete information. The lists below are available upon request to tool user 11.

List of all information entities 34 that do not indicate a defining functional rule.

List of all information entities 34 that are not interrogated 44 by any functional rule 32.

List of all information entities 34 that are not modified 42 by any rule 32.

List of all information entities 34 that are interrogated 44 by a given transaction 30 by triggering 39 rules 32.

List of all information entities 34 that are modified 42 by a given transaction 30 by triggering 39 rules 32.

List of all transactions 30 that modify 42 a given information entity 34 by triggering 39 rules 32.

List of all transactions 30 that interrogate 44 a given information entity 34 by triggering 39 rules 32.

List of all dynamic functional rules 32 that are not triggered 39 by any transaction.

Figure 7:
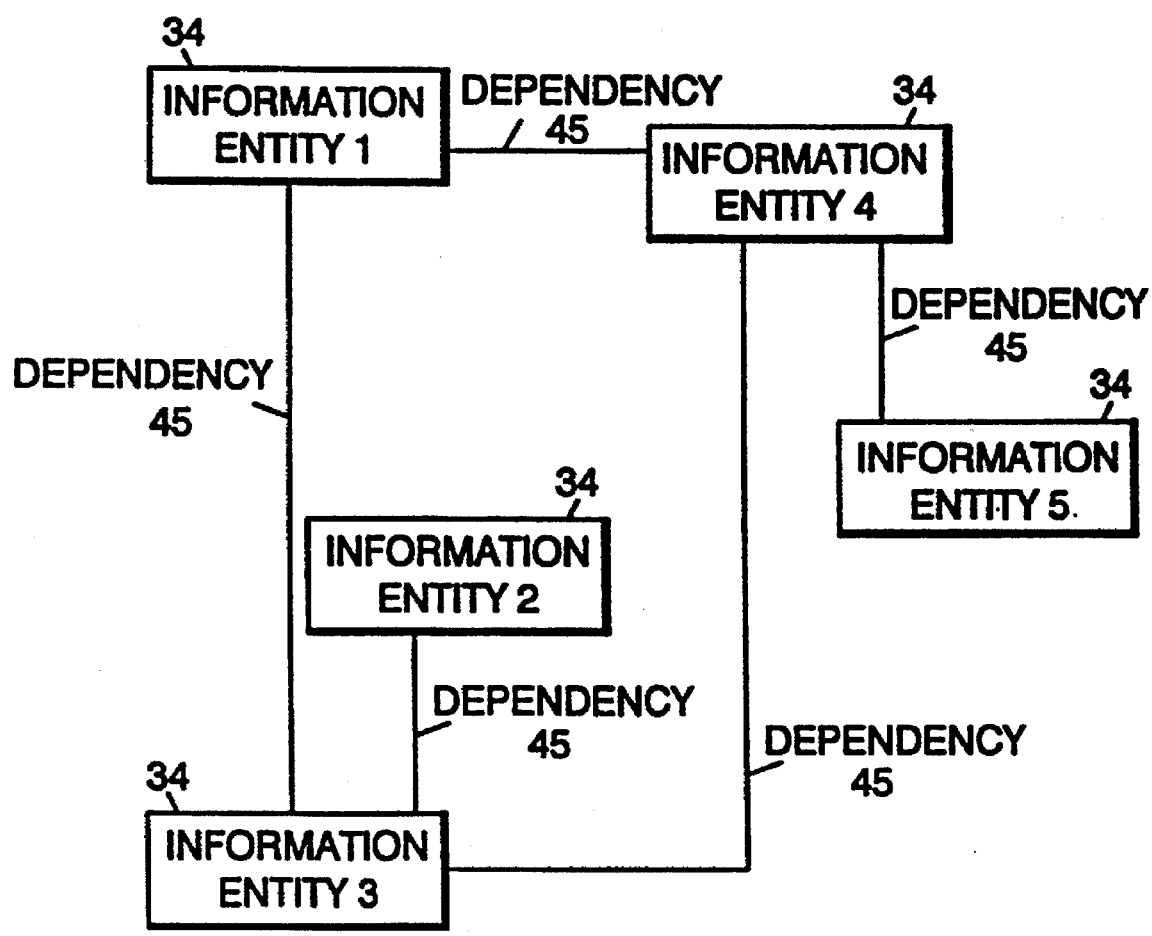
FIG. 7 shows dependencies between information entities.
Figure 8:
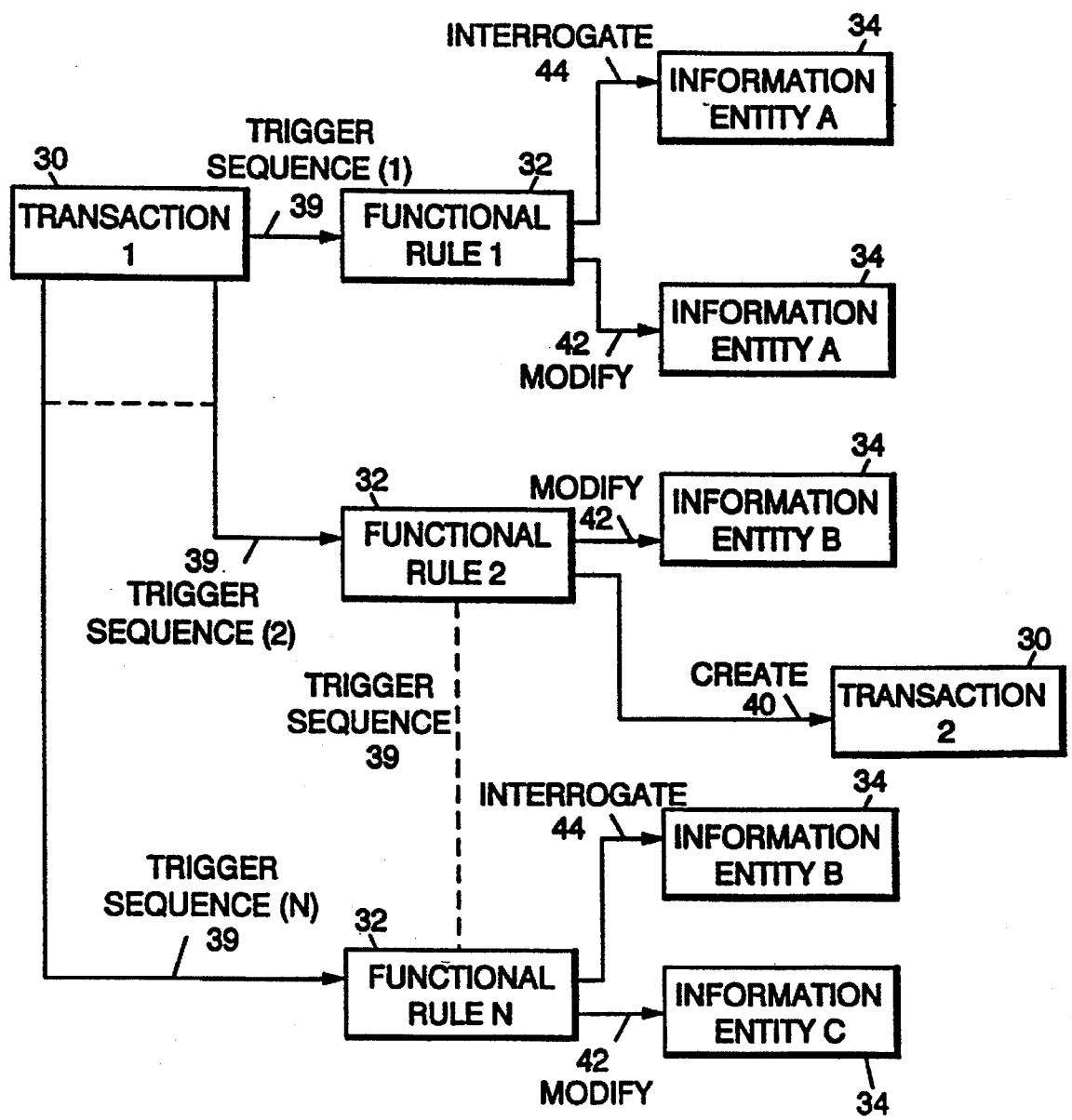
FIG. 8 shows a series of events set off by a transaction.

Structured views of the information maintained by tool 10 are exemplified in FIGS. 7 and 8. Tool 10 has the capability of producing graphical displays showing the relationships and dependencies the tool 10 has specified for the system under study similar to FIG. 7 and FIG. 8.

FIG. 7 shows a structured view of instances of information entities 34 as related by dependency connections 45. Tool users 11 can understand how system memory cells depend on each other from viewing a diagram like this, produced by tool 10. This diagram view is helpful to do the analysis leading to the definition of functional rules 32, and to aid in their specification. One core purpose of rules is to interrogate, modify, and define information entities.

FIG. 8 shows a view of a transaction 30 and its effects, as defined to tool 10. Referring back to FIG. 3, a transaction 30 is created by user 27, or a functional rule 32, and serves as a means for interfacing between system user 27 and system 16. The transaction 30 also has a connection called trigger sequence 39 that allows transaction 30 to trigger functional rules 32. The trigger sequences are numbered to show that the sequence can be specified. Each functional rule 32 allows us to trace its connections to information entities 34 through interrogate connections 44 and modify connections 42, and to other transactions through the create connection 40.

Tool 10 has the capability of creating a diagram showing the internal and external details of a given component upon request by user 27. User 27 can browse through the component contents and connections and update them at will.

Returning to FIG. 2, tool 10 also includes multiple system facilities 23. In most real world cases, a tool user 11 decides to work on a system that needs to be defined or upgraded, but the system under study interacts with other systems within the same environment. These other systems may share resources with the system under consideration, and the tool 10 needs to accommodate this need.

Tool 10 supports the specification of multiple systems (with individual given names) concurrently. The "name of owning system" attribute in the definition of transactions 30, information entities 34, and functional rules 32 indicates the name of the system associated with the component. Large systems are arbitrarily partitioned into smaller systems to facilitate management and control of complex operations. Tool 10 can create forms that show all systems defined so far, so the user 27 can begin his/her work on a manageable part rather than the total environment.

Transactions 30, rules 32 and information entities 34 are defined as belonging to a single system for simplicity. For example, input validation facilities 21 and query facilities 24 produce lists and graphical views that are scoped by the system name. That is, they stop at system boundaries. On the other hand, systems need to interact with each other. Therefore, while a transaction 30 is assumed to belong uniquely to a given system, it may be passed to other systems after it is processed by its owning system. An information entity 34 is also owned by one system, but other systems may own rules 32 that interrogate or modify it. Similarly, functional rules 32 are owned by a system, but can be invoked by functional rules 32 that belong to another system.

The input validation facilities 21, and query and reporting facilities 22, produce lists and graphical views that contain only those components and connections belonging to the system being examined. That is, they stop at system boundaries.

In FIG. 2, permanent storage facilities 24 allow the information entered by the tool's user 11 to be stored for future reference. The permanent storage facilities 24 allows access and update of the components (transactions 30, functional rules 32, and information entities 34). To support the creation of versions, the permanent storage facilities 24 allow the creation of copies of a system's instances, or defined values of concepts or elements, under different names. The original can become a frozen version, and the copy can be modified as definitions evolve through time.

Figure 9:
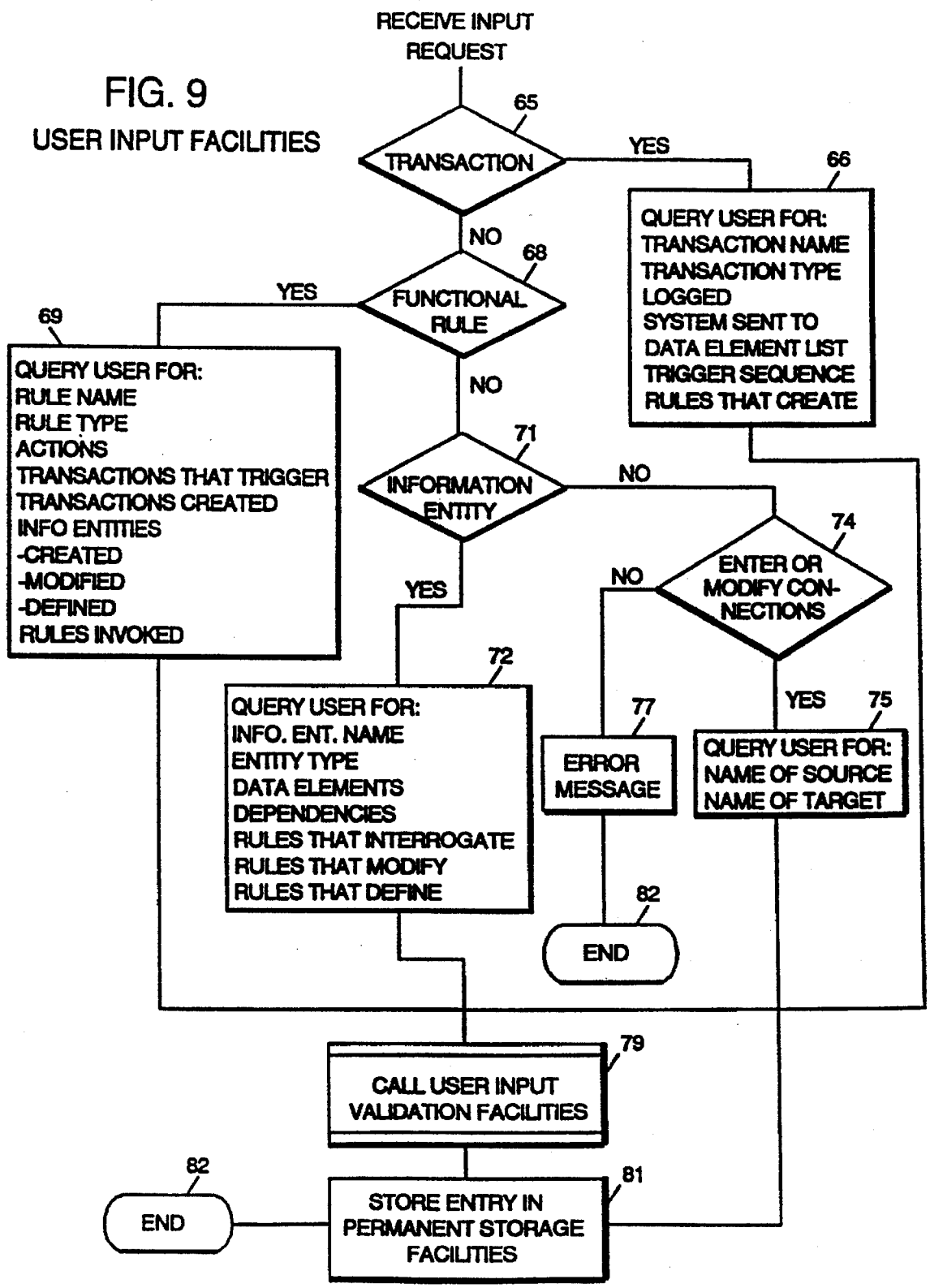
FIG. 9 shows a flow diagram of the user input facilities of FIG. 2.

FIG. 9 is a flow diagram of user input facilities 20. When tool 10 receives an input request from tool user 11 via multiple system facilities 23, shown in FIG. 12, decision 65 determines whether the input is a transaction. If so, operation 66 queries the user for the elements of the transaction. If not, decision 68 determines whether the input is a functional rule. If so, operation 69 queries the user for the elements of a rule. Decision 71 asks if the input is an information entity, and operation 72 queries the user for information entity elements if so. Decision 74 determines whether the user wishes to enter or modify connections, and operation 75 queries the user for the source and the target of the connection if so. Normally, connections are established as transactions, rules, and information entities are entered, but they may also be added independently. The tool 10 enters the new connection into permanent storage 24 in operation 81 and ends, 82.

If the user has entered a transaction, a rule, or an information entity, subroutine 79 calls the user input validation facilities to validate the input component. The entry is stored in the permanent storage facilities 24 by operation 81, and the process ends, 82. If neither a transaction, a rule, an information entity, or a connection was specified, an error message is put out by tool 10 in operation 77, and the process ends, operation 82.

Figure 10:
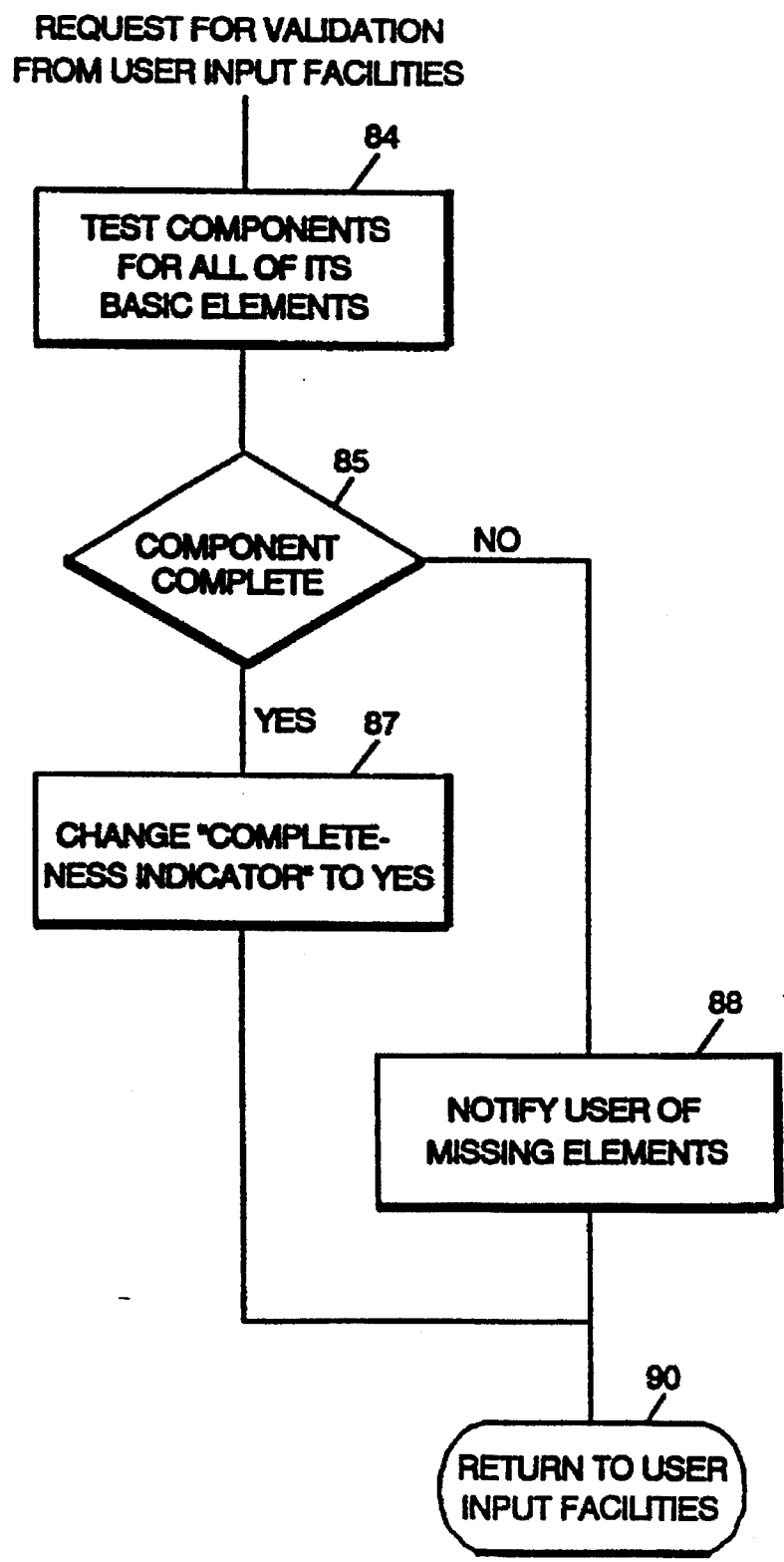
FIG. 10 shows a flow diagram of the user input validation facilities of FIG. 2.

FIG. 10 shows a flow diagram of the user input validation facilities 21 of tool 10. This subroutine is invoked by the user input facilities 20, shown in FIG. 9. Operation 84 tests the input component for the requisite elements. Decision 85 determines whether the component is complete. Operation 87 changes the completeness indicator of the component to "YES" if so, and operation 88 notifies the user 11 of the missing elements if not. Then the subroutine returns to user input facilitates 20.

Figure 11:
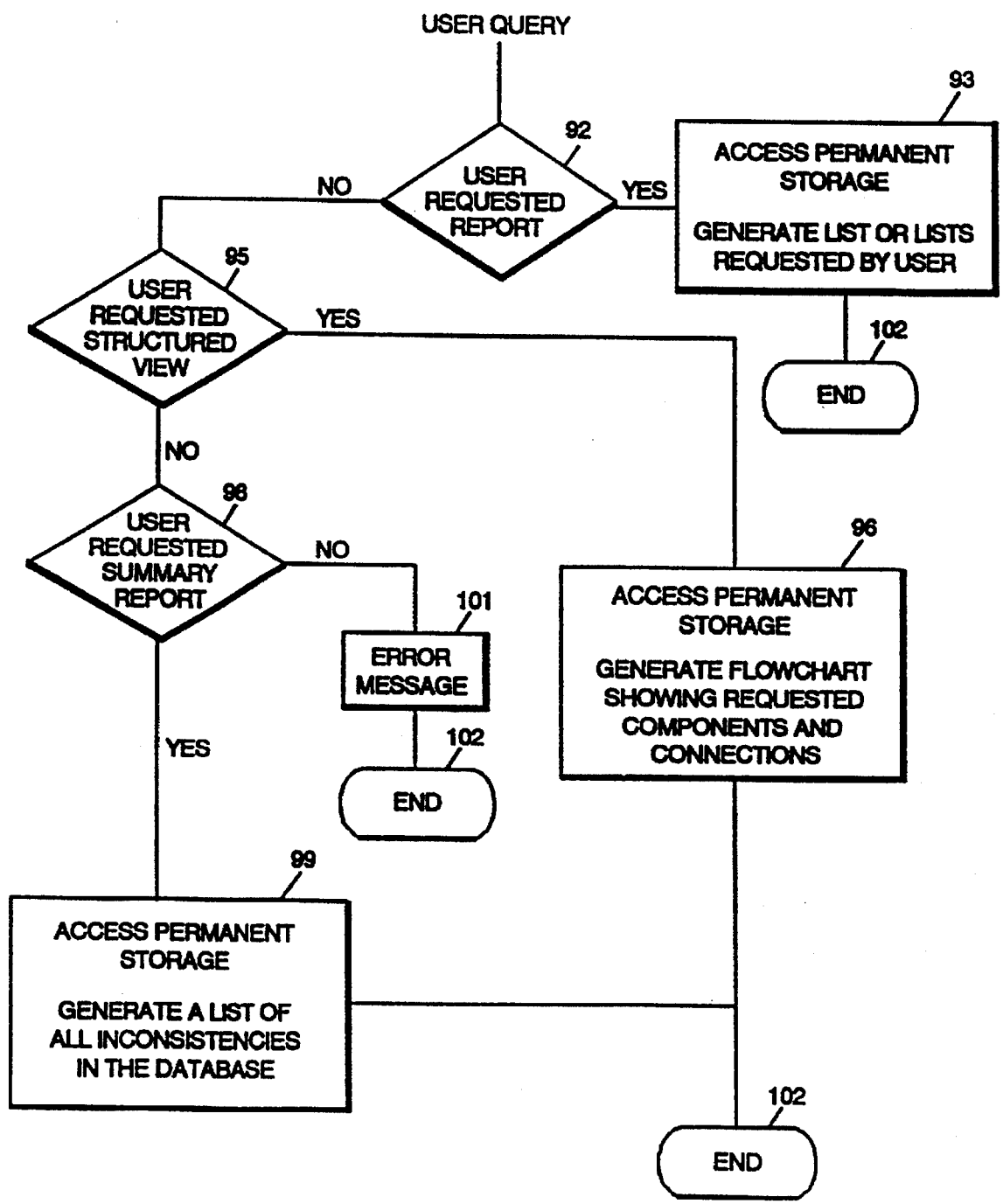
FIG. 11 is a flow diagram of the user query and reporting facilities of FIG. 2.

FIG. 11 shows a flow diagram of the user query and reporting facilities 22 of tool 10. Decision 92 checks whether the user 11 requested a report, and operation 93 accesses permanent storage 24, and generates the report requested if so. Decision 95 asks whether the user 11 requested a structured view, and operation 96 generates the view if so. Decision 98 determines whether user 11 requested a summary report of all of the inconsistencies in the database, and operation 99 generates the report if so. If none of the above options was selected, an error message 101 is generated. The process ends, 102.

Figure 12:
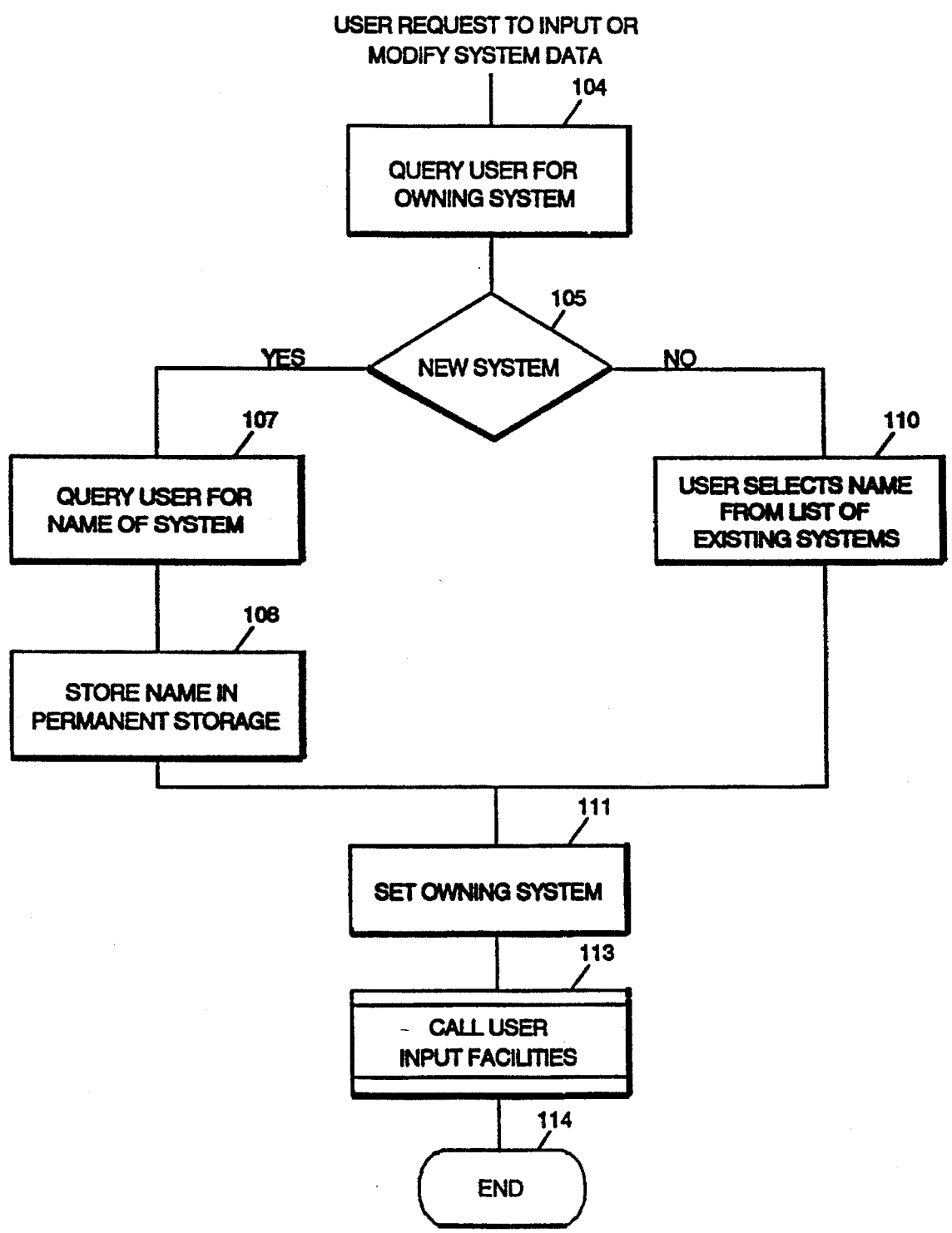
FIG. 12 is a flow diagram of the multiple system facilities of FIG. 2.

FIG. 12 shows a flow diagram of the multiple system facilities 23. Multiple system facilities 23 is activated by a user request to enter, or modify, tool 10 data. The facility queries the user 11 to select a new or existing owning system in operation 104. Decision 105 determines whether the user requested a new system. If so, operation 107 queries the user for the name of the system, and operation 108 enters the new system into permanent storage 24. If not, the user selects the existing system's name from a list in operation 110. Either way, the owning system is set in operation 111, and subroutine 113 calls the user input facilities to enter the data in operation 113. The system ends, 114.

The present invention is useful in specifying and understanding an infinite variety of systems, and is not intended to be limited to specifying any one type. To illustrate the invention and facilitate its understanding, FIGS. 13 through 32 show an example of specifying an elevator system.

FIGS. 13 through 32 illustrate a particular example of a system 16 organized and described by tool 10. The system 16 selected to demonstrate the use of the tool 10 is an elevator (not shown). Tool 10 organizes and describes the external actions of the elevator. These actions are expressed in terms of transactions 30, and for each transaction the functional rules 32 that it evokes. Functional rules 32 are capable of defining 41, interrogating 44 and modifying 42 information entities 34. It is helpful while reviewing this example to refer back to FIGS. 1–3. For this reason, elements of FIGS. 1–3 are discussed in terms of their reference numerals, even though the display screens shown in FIGS. 13–32 do not have reference numerals.

The system 16 function specification accomplished by tool 10 has the following purposes: To describe the system activity in such a way that it is meaningful to the tool user 11, to specify a development contract between customers who order system 16 and designers who develop the system 16, and to be the source of test cases used to validate the system 16 when finished.

The following specification of an elevator is not the only possible specification. Specification of a system 16 is guided by tool 10, but different tool users 11 may describe the same action in different ways, or concentrate on different aspects of the action. At least the terminology used (for naming elements) will vary from person to person. This example is typical, but it is by no means unique.

The elevator is a simple system, and this example was further simplified for ease of understanding. The benefit of the tool 10 should be evident even for a small example such as this, but the complexities involved when a system description has tens of transactions and information entities, and possibly hundreds of functional rules make the tool 10 indispensable for defining and describing complex systems.

FIGS. 13 through 29 show interactive displays that tool 10 has sent to display 14 and tool user 11 has filled out. These displays appear as they would after validation facilities 21 have been invoked. They are in final form, without conflicts or incomplete entries. FIGS. 13 through 18 show transactions 30, which are interactions between the system user 27 (in this case, an elevator user), and the system 16 (in this case, an elevator). The transactions, functional rules, and information entities are entered into the tool 10 by user 11, as shown in FIG. 9, and are validated as shown in FIG. 10.

FIG. 13 shows a transaction called PRESS UP-EXTERNAL BUTTON. The system user 27 interacts with the elevator by pressing a button from a given floor indicating that he/she wants to travel to a higher floor. The first field is filled in with the transaction name, PRESS-UP EXTERNAL BUTTON. The name was selected in user input facilities 20, as shown in FIG. 9. The next field indicates that the display is complete; i.e., no necessary entries are incomplete or outside of permitted ranges. This field was set by user input validation facilities 21, as shown in FIG. 10. The third field indicates that elevator is the owning system. The owning system was selected in multiple system facilities 23, as shown in FIG. 12. In this example, elevator is the only system described, but the possibility of two or more interdependent systems was discussed in conjunction with FIG. 2 in the discussion of multiple system facilities 23. The next field shows the transaction type. In this case, the transaction is an event notification because the user 27 is passing information to the system 16. The fifth field shows who created the transaction. In this case, the system user 27 created the transaction by pushing the button. The transaction is not logged because there is no reason to keep track of the fact that this transaction occurred, once the user 27 request is met. The last field in the first section indicates that the transaction was not sent to any other systems. The list of data elements 50 comprises Signal_Request_Up and Number_Floor, meaning that these elements are the information passed to tool 10 by the transaction 30. Signal_Request_Up indicates that user 27 wants to go up, and Number_Floor indicates which floor user 27 is currently on. The next entry indicates that this transaction 30 triggers a rule 32, called UP PICK-UP, shown in FIG. 25. The last field indicates that no rules 32 create this transaction 30. It is only created by users 27.

FIG. 14 shows a transaction 30 called PRESS DOWN-EXTERNAL BUTTON. The user 27 interacts with the elevator by pressing a button from a given floor indicating that he/she wants to travel to a lower floor. This transaction 30 is nearly identical to PRESS UP-EXTERNAL BUTTON. Only the transaction 30 name, list of data elements 50, and trigger sequence 39 is different. The different data element 50 passed is Signal_Request_Down, indicating to system 16 that user 27 wants to go down. The rule 32 triggered is DOWN PICK-UP, shown in FIG. 26.

FIG. 15 shows a transaction 30 called PRESS FLOOR-INTERNAL BUTTON. The user 27 interacts with the elevator by pressing a button inside the elevator indicating what floor he/she wants to travel to. This transaction is similar to the first two discussed, as it is another event notification created by the system user 27. The data element 50 passed is Signal_Go_To_Floor, which tells system 16 which floor to go to. This transaction triggers two rules 32, SET FLOOR REQUESTS and PASSENGER TRAVEL, shown in FIGS. 23 and 27A-B.

FIG. 16 shows a transaction 30 called DISPLAY STATE. The elevator interacts with the user 27 by showing what floor it is at, and the current direction of travel (up or down). This is a report transaction created by the system 16. Thus, field four indicates a report transaction, and field five indicates that system 16 created the transaction. The data elements 50 reported to system user 27 to indicate elevator direction and location are Going_Up, Going_Down, and Number_Floor_Current. No rules 32 are triggered by this transaction. The rule that creates this transaction is SET FLOOR REQUESTS, shown in FIG. 23.

FIG. 17 shows a transaction 30 called STOP, OPEN, AND CLOSE DOOR. The elevator allows the user 27 to enter, or exit the car by stopping, opening, and closing the door. Like DISPLAY STATE, this transaction is a report by the system. No data elements 50 are passed, but two rules 32 are triggered, RESET FLOOR REQUESTS and DETERMINE DIRECTION, shown in FIGS. 24 and 28A-B. This transaction is created by three different rules, UP PICK-UP, DOWN PICK-UP, and PASSENGER TRAVEL shown in FIGS. 25, 26, and 27A-B.

FIG. 18 shows a transaction 30 called PASS-BY WITHOUT STOPPING. The elevator passes through a floor without stopping. Even though this operation does not affect travel, the system user 27 sees it, and wants to specify under what conditions this is an acceptable mode of functioning for the elevator, due to overall efficiency of travel. This is another report transaction created by the system 16. No data elements 50 are passed, and no rules 32 are triggered. The rules that can create this transaction are UP PICK-UP, DOWN PICK-UP, and PASSENGER TRAVEL, shown in FIGS. 25, 26, and 27A-B.

FIGS. 19 and 20 show information entities, 34. They represent groupings of information that the user 27 expects the elevator needs to keep current as transactions 30 occur. Each information entity 34 has meaning as a group of data elements, and can have dependencies on other information entities 34.

FIG. 19 shows an information entity 34 called ELEVATOR POSITION. This information entity 34 is needed to indicate the current floor position of the elevator. The first field shows the information entity name. The next entry is the completeness indicator. Next is the name of the owning system, and the last entry in the first section is the information entity type. The type, in this case, is descriptor, meaning it keeps system 16 informed of external events as they occur, but does not keep track of past events like a log does.

The only data element for this information entity is Number_Floor_Current, indicating which floor the elevator is on. The next field keeps track of data dependencies between this information entity and other information entities. In this case, dependency connections Going_Up and Going_Down relate ELEVATOR POSITION to FLOOR REQUESTS. For example, if the elevator is on the fifth floor and the only floor request is for the seventh floor, the elevator should go up. But if the elevator is on the tenth floor it should go down. If one of the two dependencies is ON the other one must be off, because it is impossible for the car to travel in two directions at any given time. It is possible that neither is ON because the elevator may be quiesced, with no request to satisfy. The two dependency connections Going_Up and Going_Down are very dynamic, in that they are turned ON and OFF frequently. As we will see, rules DEFINE ELEVATOR POSITION and DETERMINE DIRECTION, shown in FIGS. 21 and 28A–B, place constraints on Going_Up and Going_Down.

No functional rules 32 interrogate, or modify, this information entity. DEFINE ELEVATOR POSITION, shown in FIG. 21, defines this information entity. Only static rules define information entities 34. Information entities are modified by dynamic rules which are triggered by transactions 30.

FIG. 20 shows an information entity 34 called FLOOR REQUESTS. This information entity 34 is needed to record the requests for travel that the elevator has yet to service. It has information for each floor that shows whether the internal button for that floor was pressed, whether the external button on that floor was pressed to go up, and whether the external button on that floor was pressed to go down. Thus, the data elements 50 listed are Number_Floor, and for each floor Signal_Go_To_Floor, Signal_Request_Down, and Signal_Request_Up. No rules 32 interrogate, or modify, this information entity, but it is defined by DEFINE FLOOR REQUESTS shown in FIG. 22.

FIGS. 21 through 28A–B show functional rules 32. Rules 32 define, interrogate and modify information entities 34, invoke other rules 32, and create transactions 30. They are also classified as being static (valid at all times) or dynamic (invoked by the occurrence of certain transactions).

FIG. 21 shows a rule 32 called DEFINE ELEVATOR POSITION. This rule 32 is a static rule that specifies the valid states for the information entity called ELEVATOR POSITION, shown in FIG. 15. The fourth field indicates that this rule is static; i.e., it is always active without any conditions being met. Thus, under ACTION(1) (the only action in this rule) the condition is ALWAYS. No other rules are invoked. DEFINITION OR MODIFICATION OF INFORMATION ENTITIES indicates that both dependencies, GOING-UP and GOING-DOWN, cannot be ON at the same time, and the valid range of vales for the data element called Number_Floor_Current is from 1 to Floormax. No transactions 30 are created and the continuation indicator reads CONTINUE, meaning that action proceeds rather than stopping or repeating. No transactions 30 trigger this rule. Also, no transactions are created by this rule. This is clear from the NAME OF CREATED TRANSACTIONS entry above, but the current entry is a summary of all of the transactions created by all of the actions in the rule and, thus, is useful in more complicated rules. No information entities are interrogated, or modified, but ELEVATOR POSITION shown in FIG. 19 is defined.

Referring back to FIG. 19, we see that DEFINE ELEVATOR POSITION is named as a rule that defines ELEVATOR POSITION. Thus, the connection (define 41 in this case) between the rule and information entity is defined from both ends. The validation facilities 21 will indicate if there is some mismatch between the two ends of the connection.

FIG. 22 shows a rule 32 called DEFINE FLOOR REQUESTS. This rule 32 is a static rule that defines characteristics of the data elements grouped under the information entity called FLOOR REQUESTS, for each floor that the elevator services. DEFINITION OR MODIFICATION OF INFORMATION ENTITIES indicates that Number_Floor must be between 1 and Floormax, and a given floor may have all three signals (Signal_Go_To_Floor, Signal_Request_Down, and Signal_Request_Up) ON at the same time. Also, the elevator is quiesced if all three signals are off for all floors. No transactions 30 are created, and the continuation indicator reads CONTINUE. No transactions 30 trigger this rule, and none are created by this rule. The information entity defined by this rule is FLOOR REQUESTS.

FIG. 23 shows a rule 32 called SET FLOOR REQUESTS. This rule is a dynamic rule that indicates the need to turn ON the signals for different floor buttons in the FLOOR REQUESTS information entity (FIG. 20) by modifying its data elements. Also, it creates an instance of transaction DISPLAY STATE because we want all requests to be visible to elevator users 27 as soon as the elevator receives them. Field four indicates that this rule is dynamic, meaning it is triggered by a transaction 30.

No rules are invoked. The DEFINITION OR MODIFICATION OF INFORMATION ENTITIES field indicates that signals are turned on for floors when those floors are requested by a user 27 pushing an internal button. Also, Signals Go_To_Floor, Request_Down, and Request_Up in FLOOR REQUESTS are modified to indicate both all floors requested by pressing the internal buttons, and requests to travel up or down from external buttons. This rule is triggered by the PRESS FLOOR-INTERNAL BUTTON transaction, shown in FIG. 15, and the STOP, OPEN, AND CLOSE DOOR transaction shown in FIG. 17.

This rule is also invoked indirectly by the two other transactions that support floor buttons through the UP PICK-UP and DOWN PICK-UP functional rules.

FIG. 24 shows a rule 32 called RESET FLOOR REQUESTS. This rule is identical to SET FLOOR REQUESTS, except that it turns OFF the signals for different floor buttons once the STOP, OPEN, AND CLOSE DOOR is complete for that floor.

FIG. 25 shows a rule called UP PICK-UP. This rule is a dynamic rule that indicates the expected function when a floor button is pressed for travel in the up direction. For ACTION(1), the condition expression is either the elevator is going UP and is at or lower than the pickup point and the user 27 wants to go up or the elevator is going DOWN and is at or higher than the pick-up point and the user 27 wants to go up, but there is also a request to stop at that floor. Under either of these conditions, the elevator is obviously going to stop and pick up the passenger. Thus, ACTION(1) creates the STOP, OPEN, AND CLOSE DOOR transaction (FIG. 17). The rule SET FLOOR REQUESTS is invoked. It keeps track of and displays all unmet floor requests.

The condition expression for ACTION(2) is the elevator is going down and is higher than the pickup point, but there is no request to stop there and user 27 wants to go up. The rule SET FLOOR REQUESTS is invoked. No information entities are modified or defined. The transaction PASS-BY WITHOUT STOPPING is created because there is no reason to stop at this floor. In the summary section, the transaction that triggers this rule is PRESS UP-EXTERNAL BUTTON (FIG. 13). The transactions created are STOP, OPEN, AND CLOSE DOOR and PASS-BY WITHOUT STOPPING (FIGS. 17 and 18). The information entities interrogated to determine whether the conditions are true are ELEVATOR POSITION and FLOOR REQUESTS (FIGS. 19 and 20).

UP PICK-UP is so named because it is triggered by the PRESS UP-EXTERNAL BUTTON transaction; i.e., this rule is active when a user 27 wants to be picked up to travel upward. It has two actions, depending on the expected function under the two possible conditions. The user expects the car to stop the first time it passes through and allow the user to enter (through the STOP, OPEN, CLOSE DOOR transaction) if the directions of travel coincide. Also, the elevator picks up user 27 if the elevator is going in the opposite direction, but someone inside the elevator wants off at the user's floor. On the other hand, the elevator does not stop if the directions do not coincide, and no one wants off at the user's floor. The PASS-BY WITHOUT STOPPING transaction is created, in this case.

FIG. 26 shows a rule called DOWN PICK-UP. This rule specifies the mirror image of the UP PICK-up functional rule; i.e., it specifies the elevator's functioning when the user 27 creates the PRESS DOWN-EXTERNAL BUTTON transaction.

FIGS. 27A–B show a rule called PASSENGER TRAVEL. This rule is a dynamic rule, triggered by the PRESS FLOOR-INTERNAL BUTTON transaction, that accounts for the actions of the elevator immediately after the user 27 enters the car and presses the button for the destination floor. The rule has three actions. The condition for ACTION(1) is that the elevator direction and the user 27 direction coincide, and there are no requested stops (either internally or externally) in between the current floor and the user's requested floor. In this case, the PASS-BY WITHOUT STOPPING and STOP, OPEN, AND CLOSE DOOR transactions (FIGS. 18 and 17) are created. The elevator passes by any floors before the user's floor, and stops at the user's floor.

The condition for ACTION(2) is that the elevator direction and the user 27 direction coincide, but there are requested stops in between. In this case, the transaction STOP, OPEN, AND CLOSE DOOR is created because the elevator stops at the requested stop.

The condition for ACTION(3) is that the directions do not coincide. Functional rule DETERMINE DIRECTION (FIG. 28) is invoked because the user 27 expects the elevator to reevaluate its direction of travel, taking the user directly to his/her destination if there are no pending requests in the original direction of elevator travel.

The Transaction that triggers this rule is PRESS FLOOR-INTERNAL BUTTON (FIG. 15). The transactions which may be created by this rule are STOP, OPEN, AND CLOSE DOOR and PASS-BY WITHOUT STOPPING (FIGS. 17 and 18). This rule interrogates the ELEVATOR POSITION information entity (FIG. 19), and interrogates and modifies the FLOOR REQUESTS information entity (FIG. 20).

FIGS. 28A–B show a rule 32 called DETERMINE DIRECTION. This rule is a dynamic rule whose task is to specify the handling of the Going-Up and Going-Down dependency connections. The condition for ACTION(1) is that Going_Up is ON, and there are no requests for higher floors. The DEFINITION OR MODIFICATION OF INFORMATION ENTITIES sets Going_Up to OFF. Similarly, ACTION(2) sets Going_Down to OFF when it is ON but there are no requests for lower floors.

ACTION(3) sets Going_Down to ON when neither dependency connection 45 is ON, and there is a request for a lower floor. Similarly, ACTION(4) sets Going_Up to ON when neither Going_Up or Going_Down is ON and there is a request for a higher floor. This rule 32 is triggered 39 by the STOP, OPEN, AND CLOSE DOOR transaction 30. Thus, the dependency connections 45 are reevaluated whenever the elevator stops. The information entities 34 interrogated 44 are ELEVATOR POSITION and FLOOR REQUESTS, shown in FIGS. 19 and 20.

In this rule, the fact that actions are processed sequentially is illustrated. Because actions are processed sequentially, the first two actions ensure that unnecessary commitments to direction of travel are turned OFF, allowing the second set of actions to establish a new direction, if possible. This also ensures that the current direction of travel is given priority (the elevator services all requests in a given direction before turning around).

This rule is invoked by the PASSENGER TRAVEL functional rule, and triggered by the STOP, OPEN AND CLOSE DOOR transaction (after the RESET FLOOR REQUESTS rule).

FIGS. 29 through 32 show views created by tool 10 through its user query and reporting facilities 22, as shown in FIG. 11.

FIG. 29 shows a DATA ELEMENT DICTIONARY created by the user query and reporting facilities 22. It is a listing of data elements from all transactions and information entities. The tool 10 produces this list to allow double checking and management of name consistency across all elements defined in the system.

Figure 30:
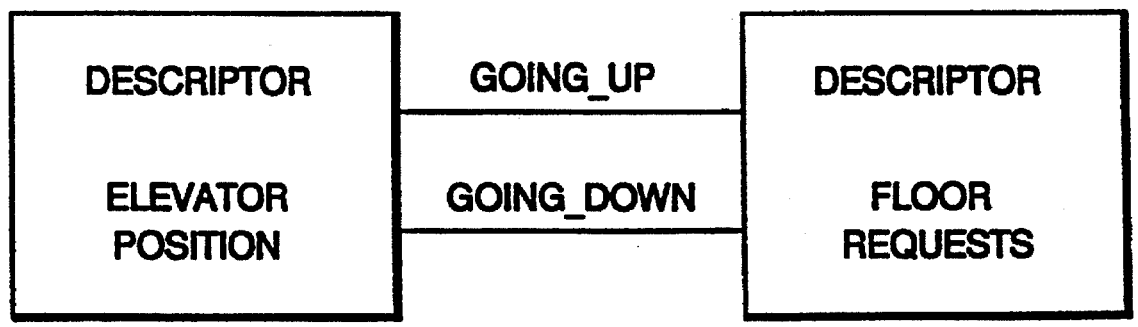
FIG. 30 shows the dependencies between the information entities of FIGS. 20 and 21.

FIG. 30 illustrates a diagram showing the dependencies between information entities created by query and reporting facilities 22. It is a concrete example of the general diagram shown in FIG. 7. It provides a graphical view of all information entities and dependency connections. In the elevator case, information entities 34 ELEVATOR POSITION and FLOOR REQUESTS (FIGS. 19 and 20) were connected by dependency connections 45 Going_Up and Going_Down.

Figure 31:
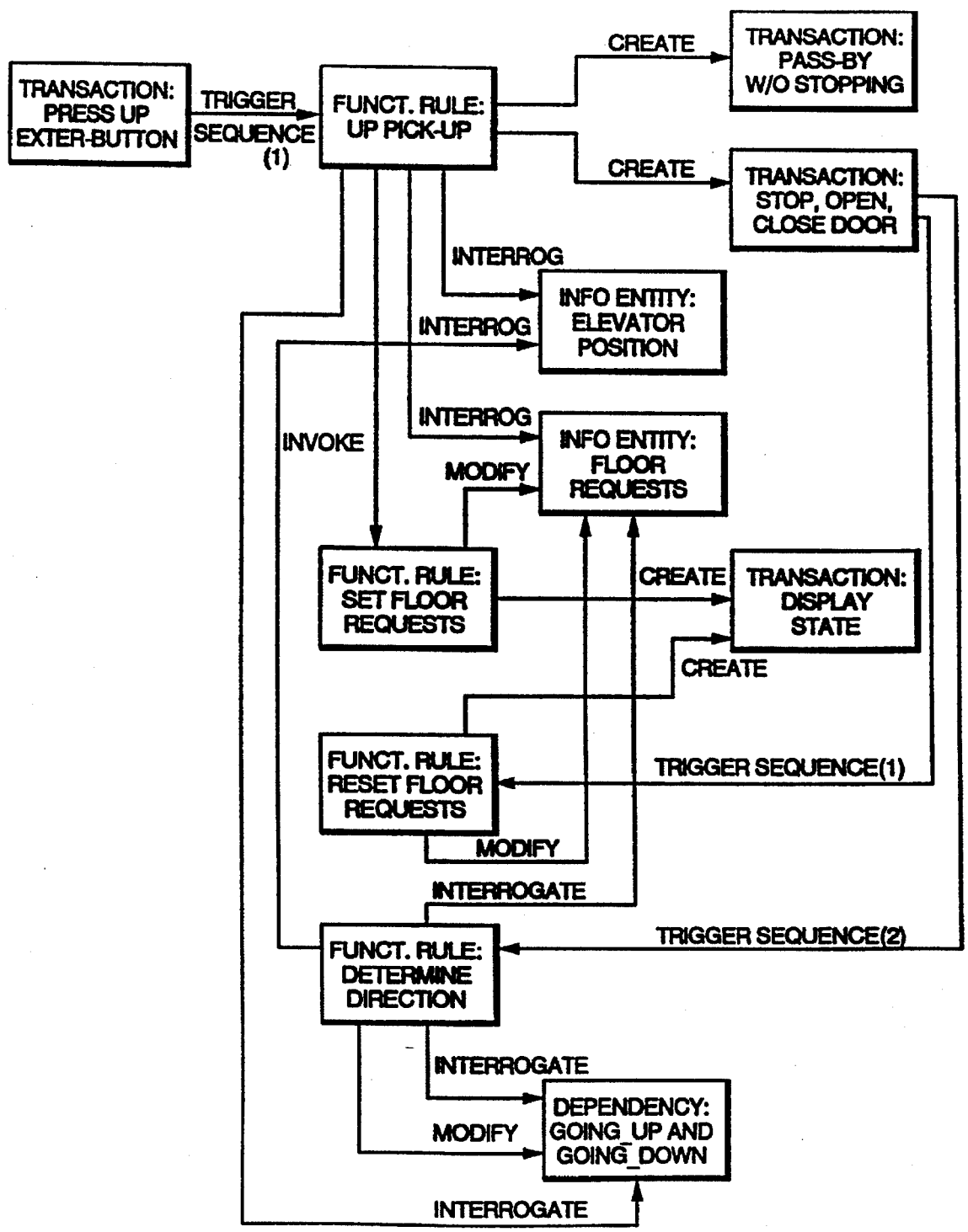
FIG. 31 shows a display of the connections and train of events evinced for the transaction PRESS UP-EXTERNAL BUTTON of FIG. 13.

FIG. 31 shows the series of events which occur when transaction 30 PRESS UP-EXTERNAL BUTTON is created by system user 16 by pressing the external button of the elevator. This diagram is created by query and reporting facilities 22. It shows the ripple effects caused in the elevator system when the transaction is created by system user 16. It is a concrete example of the general diagram shown in FIG. 8.

Elevator user 16 creates 36 transaction 30 PRESS UP-EXTERNAL BUTTON, which triggers 39 rule 32 UP PICK-UP. UP PICK-UP interrogates 44 information entities 35 FLOOR REQUESTS and ELEVATOR POSITION, and depending on the results, creates 40 transactions 30 PASS-BY WITHOUT STOPPING and STOP, OPEN, AND CLOSE DOOR. Thus, the elevator passes by the user's floor if it's going in the wrong direction and no one inside the elevator wants to stop there. It stops at user 16's floor otherwise. UP PICK-UP also invokes 43 rule 32 SET FLOOR REQUESTS.

SET FLOOR REQUESTS modifies information entity 34 FLOOR REQUESTS to reflect the request to travel from that floor upward, and creates 40 transaction 30 DISPLAY STATE so that user 16 sees the button he or she just pushed light up to indicate the user's request has been received. The user will also see the elevator's direction and location if those displays are provided at the user's floor. Transaction 30 STOP, OPEN, AND CLOSE DOOR triggers 39 rule 32 RESET FLOOR REQUESTS which modifies 42 information entity FLOOR REQUESTS to remove the user's request now that it has been met, and triggers 39 rule 32 DETERMINE DIRECTION. DETERMINE DIRECTION interrogates 44 information entities 34 FLOOR REQUESTS and ELEVATOR POSITION to decide which direction the elevator should move now that the user is on board.

Figure 32:
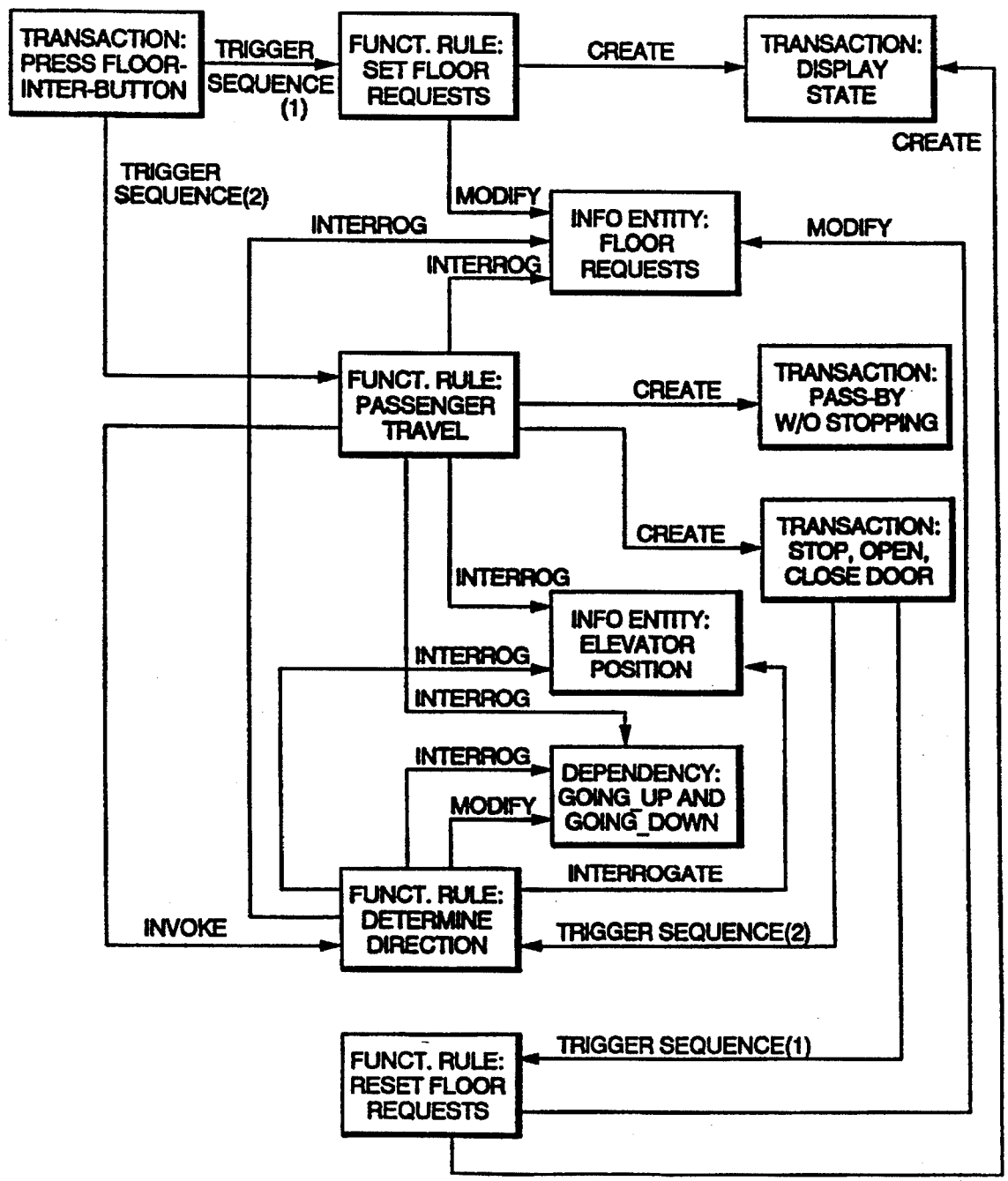
FIG. 32 shows a display of the connections and events evinced for the transaction PRESS FLOOR-INTERNAL BUTTON of FIG. 15.

FIG. 32 shows the series of events which occur when transaction 30 PRESS FLOOR-INTERNAL BUTTON is created by system user 16 by pressing a floor button inside the elevator. This diagram is also created by the query and reporting facilities 22, as shown in FIG. 11. It shows the ripple effects caused in the elevator system when the transaction is created by user 16. It is a concrete example of the general diagram shown in FIG. 8.

Transaction 30 PRESS FLOOR-INTERNAL BUTTON triggers 39 rules 32 SET FLOOR REQUESTS which creates 40 transaction 30 DISPLAY STATE and PASSENGER TRAVEL. Thus, elevator user 16 sees a display of where the elevator is, and which direction it is going. SET FLOOR REQUESTS also modifies 42 information entity 34 FLOOR REQUESTS. PASSENGER TRAVEL invokes DETERMINE DIRECTION, interrogates 44 information entities 34 FLOOR REQUESTS and ELEVATOR POSITION and creates 40 transactions 30 PASS-BY WITHOUT STOPPING and STOP, OPEN, AND CLOSE DOOR. Thus, the elevator passes by floors where there is no request to stop to get to user 16's floor, where it stops and lets user 16 on. Transaction 30 STOP, OPEN, AND CLOSE DOOR also triggers rule 32 RESET FLOOR REQUESTS to remove the original request now that it has been met. RESET FLOOR REQUESTS must modify 42 information entity 34 FLOOR REQUESTS and create 40 transaction 30 DISPLAY STATE. STOP, OPEN, AND CLOSE DOORS triggers 39 rule 32 DETERMINE DIRECTION, which interrogates 44 FLOOR REQUESTS to determine what the elevator should do next.

While the exemplary preferred embodiments of the present invention are described herein with particularity, those having normal skill in the art will recognize various changes, modifications, additions, and applications other than those specifically mentioned herein without departing from the spirit of this invention.

What is claimed is:

1. A method for defining, evaluating and developing specifications for a desired complex system, within the framework of a structured complex system meta-model, in a computer having an input means, a processing means, a presentation means, and a storage facility; said method comprising the computer implemented steps of:

storing the structured complex system meta-model, in said storage facility, said meta-model including a plurality of meta-model components, wherein each meta-model component includes basic component elements and connections to other of said plurality of meta-model components;

storing a meta-model query in said storage facility for each of said meta-model components, said query directed to said basic component elements and connections;

presenting, on the presentation means, a plurality of said meta-model queries for the components of the desired complex system;

accepting, from the input means, an input responsive to each of said plurality of meta-model queries for the components of the desired complex system;

storing each of said input responsive to said queries, in said storage facility, as part of the specifications for the desired complex system;

testing for completeness said input responsive to said queries, said testing for completeness performed by enforcing said structured complex system meta-model on the desired complex system; and presenting notice, on the presentation means, of completeness as determined in said step of testing for completeness.

2. A method as defined in claim 1, wherein said storing in said storage facility of said plurality of meta-model components includes the substeps of:

storing a transaction component representing interactions between a complex system and a system user, a functional rule component representing all the expected results of a transaction, and an information entity component representing the state of the system; and wherein the step of storing in said storage facility a meta-model query for each of said meta-model components, includes the substeps of:

storing a transaction component query, a functional rule component query and an information entity component query.

3. A method as defined in claim 2 wherein said substep of storing a transaction component query, a functional rule component query and an information entity component query comprises the steps of:

storing, for each of said components, a query for a name of each of said components, and for a name of the complex system owning each of said components;

storing, for a transaction component and for an information entity component, a query for at least one data element; and storing, for a functional rule component, a query for a sequence of one or more actions.

4. A method as defined in claim 3 further comprising the substeps of:

storing, for a transaction component, a query for a functional rule name and a connection type by which said transaction component is connected to a functional rule component; and storing, for the functional rule component, a query for an information entity component name and a connection type by which said functional rule component is connected to an information entity component.

5. A method as defined in claim 4 wherein said steps of testing for completeness includes the substeps of:

testing individually said input responsive to said queries to confirm the existence of all the basic component elements as enforced by said stored complex system meta-model; and testing globally said input responsive to said queries to confirm the existence of:

a connection between each transaction component and a functional rule component, between each functional rule component and an information entity component, and between each information entity component and a functional rule component.

6. The method as set forth in claim 5 wherein said step of presenting notice of completeness includes the substeps of:

presenting notice, on the presentation means, of a missing basic component element as determined in said step of testing individually; and presenting notice, on the presentation means, as determined in said step of testing globally of:

a transaction component that does not have a connection to a functional rule component, a functional rule component which does not have a connection to an information entity component, and an information entity component which does not have a connection to a functional rule component.

7. The method as set forth in claim 2 wherein said step of testing for completeness includes the substeps of:

testing individually said input responsive to said queries to confirm the existence of all the basic component elements as enforced by said stored complex system meta-model; and testing globally said input responsive to said queries to confirm the existence of all the basic component connections as enforced by said stored complex system meta-model.

8. The method as set forth in claim 7 wherein said step of presenting notice of completeness includes the substeps of:

presenting notice, on the presentation means, of a missing basic component element as determined in said step of testing individually; and presenting notice, on the presentation means, of a missing component connection as determined in said step of testing globally.

9. A method as defined in claim 1, wherein said steps of accepting and storing input responsive to said queries further comprises the steps of:

accepting and storing input for a first desired complex system;

accepting and storing input for a second desired system; and wherein the steps of testing for completeness and presenting notice of completeness further comprises the steps of:

testing for completeness said input responsive to said queries for a combination of said first and said second desired systems; and presenting notice, on the presentation means, of completeness of said combined first and second desired systems.

10. The method of claim 1 further comprising the step of displaying, on the presentation means, notice of completeness in the form of graphic flow charts showing all components and component connections in the desired complex system.

11. A computer program for executing a computer process, said computer program being storage medium readable by a computing system and encoding a program of instructions for defining, evaluating and developing specifications for a desired complex system, within the framework of a structured complex system meta-model, said computer process comprising the steps of:

loading a structured complex system meta-model, said meta-model including a plurality of meta-model components, wherein each meta-model component includes basic component elements and connections to other of said plurality of meta-model components;

loading a meta-model query for each of said meta-model components, said query directed to said basic component elements and connections;

presenting a plurality of said meta-model queries for the components of the desired complex system;

accepting an input responsive to each of said plurality of meta-model queries for the components of the desired complex system;

storing each of said input responsive to said queries as part of the specifications for the desired complex system;

testing for completeness said input responsive to said queries, said testing for completeness performed by enforcing said structured complex system meta-model on the desired complex system; and presenting notice of completeness as determined in said step of testing for completeness.

12. The stored computer program of claim 11, wherein said loading said plurality of meta-model components includes the substeps of:

loading a transaction component representing interactions between a complex system and a system user, a functional rule component representing all the expected results of a transaction, and an information entity component representing the state of the system; and wherein the step of loading a meta-model query for each of said meta-model components, includes the substeps of:

loading a transaction component query, a functional rule component query and an information entity component query.

* * * * *